United States Patent
Qin

(10) Patent No.: US 12,484,369 B2
(45) Date of Patent: Nov. 25, 2025

(54) COMPOSITE MATERIAL AND QUANTUM DOT LIGHT EMITTING DIODE

(71) Applicant: TCL TECHNOLOGY GROUP CORPORATION, Huizhou (CN)

(72) Inventor: Huijun Qin, Huizhou (CN)

(73) Assignee: TCL TECHNOLOGY GROUP CORPORATION, Huizhou (CN)

( * ) Notice: Subject to any disclaimer, the term of this patent is extended or adjusted under 35 U.S.C. 154(b) by 1300 days.

(21) Appl. No.: 17/039,657

(22) Filed: Sep. 30, 2020

(65) Prior Publication Data

US 2021/0020858 A1 Jan. 21, 2021

Related U.S. Application Data

(63) Continuation of application No. PCT/CN2019/104735, filed on Sep. 6, 2019.

(30) Foreign Application Priority Data

Sep. 7, 2018 (CN) .......................... 201811046064.X
Sep. 7, 2018 (CN) .......................... 201811046126.7

(51) Int. Cl.
| | |
|---|---|
| *H10K 50/115* | (2023.01) |
| *C09K 11/54* | (2006.01) |
| *C09K 11/88* | (2006.01) |
| *H10K 50/16* | (2023.01) |

(52) U.S. Cl.
CPC ............ *H10K 50/115* (2023.02); *C09K 11/54* (2013.01); *C09K 11/88* (2013.01); *H10K 50/16* (2023.02)

(58) Field of Classification Search
CPC ...... H10K 50/115; H10K 50/16; H10K 50/13; C09K 11/54; C09K 11/88; C09K 11/08; B82Y 40/00; H01L 33/26
USPC ......................................................... 428/323
See application file for complete search history.

(56) References Cited

U.S. PATENT DOCUMENTS

| | | | |
|---|---|---|---|
| 11,214,732 B2* | 1/2022 | Qin ....................... | C09K 11/025 |
| 2018/0151817 A1* | 5/2018 | Cho ....................... | C09K 11/883 |
| 2018/0371813 A1* | 12/2018 | Cherry ................... | E05D 11/06 |
| 2021/0020838 A1* | 1/2021 | Qin ........................ | C09K 11/06 |

FOREIGN PATENT DOCUMENTS

| | | | | |
|---|---|---|---|---|
| CN | 101191052 A | 6/2008 | | |
| CN | 102583262 A | 7/2012 | | |
| CN | 103086330 | 5/2013 | | |
| CN | 104387772 A | * 3/2015 | ............ | B82Y 30/00 |
| CN | 104974759 A | 10/2015 | | |

(Continued)

OTHER PUBLICATIONS

The World Intellectual Property Organization (WIPO) International Search Report for PCT/CN2019/104735 Dec. 2, 2019 8 Pages.

(Continued)

*Primary Examiner* — William D Young
(74) *Attorney, Agent, or Firm* — ANOVA LAW GROUP, PLLC

(57) ABSTRACT

A composite material includes a light-emitting quantum dot, and a first ligand and a second ligand bound on a surface of the light-emitting quantum dot. The first ligand includes an oil-soluble organic ligand, and the second ligand including a halogen ligand or a water-soluble ligand.

8 Claims, 4 Drawing Sheets

(56) References Cited

FOREIGN PATENT DOCUMENTS

| CN | 106449909 A | 2/2017 |
|---|---|---|
| CN | 106531860 A | 3/2017 |
| CN | 106601925 A | 4/2017 |
| CN | 106701076 A | 5/2017 |
| CN | 106753333 A | 5/2017 |
| CN | 107098324 A | 8/2017 |
| CN | 107216869 A | 9/2017 |
| CN | 107236536 A | 10/2017 |
| CN | 107760307 A | 3/2018 |
| CN | 108239535 A | 7/2018 |
| CN | 109202059 A | 1/2019 |

OTHER PUBLICATIONS

Xiyan Li et al., Bright colloidal quantum dot light-emitting diodes enabled by efficient chlorination, Nature photonics, vol. 12, Mar. 2018, p. 159-164.

Ludovico Cademartiri et al., Multigram Scale, Solventless, and Diffusion-Controlled Route to Highly Monodisperse PbS Nanocrystals, The Journal of Physical Chemistry B letters, 2006, vol. 110, No. 2, p. 671-673, Published on web Dec. 22, 2005.

Chang et al., Colloidal semiconductor nanocrystals controlled synthesis and surface chemistry in organic media, RSC Advance, vol. 4, p. 23505-23527, May 14, 2014.

John Hong et al. "Enhanced charge carrier transport properties in colloidal quantum dot solar cells via organic and inorganic hybrid surface passivation." Journal of Materials Chemistry A, (2016).

Nicholas C. Anderson et al. "Soluble, Chloride-Terminated CdSe Nanocrystals Ligand Exchange Monitored by 1H and 31P NMR Spectroscopy." Chemistry of Materials, (2013).

Alexander H.Ip et al. "Hybrid passivated colloidal quantum dot solids." Nature Nanotechnology, (2012).

Whi Dong Kim et al. "Role of Surface States in Photocatalysis Study of Chlorine-Passivated CdSe Nanocrystals for Photocatalytic Hydrogen Generation." Chemistry of Materials, (2016).

* cited by examiner

COMPOSITE MATERIAL AND QUANTUM DOT LIGHT EMITTING DIODE

CROSS-REFERENCE TO RELATED APPLICATIONS

This application is a continuation of International Application No. PCT/CN2019/104735, filed Sep. 6, 2019, which claims priority to Chinese Application Nos. 201811046064.X and 201811046126.7, both filed Sep. 7, 2018, the entire contents of all of which are incorporated herein by reference.

TECHNICAL FIELD

The present disclosure relates to quantum dot light-emitting device field, and more particularly, to a composite material, and a quantum dot light-emitting diode.

BACKGROUND

In recent years, due to characteristics of high quantum efficiency, high optical purity, and adjustable emission wavelength, etc., colloidal quantum dots have become the most promising new display materials. At present, researchers have been able to prepare quantum dot materials with photoluminescence efficiency up to 100%, which are used in biomarkers, sensor devices and light-emitting diodes (LEDs).

On the other hand, in the preparation process of quantum dot light-emitting diodes, the external quantum efficiency of a device is very low. For example, reported efficiencies of red, green, and blue devices are all lower than 20%. The reason why the photoluminescence efficiency and electroluminescence efficiency of a quantum dot material differ so much is mainly due to a fact that the quantum dot material uses optical excitation but the device uses electrical excitation. In the device structure, the quantum dot light-emitting layer has a relatively high requirement for other functional layers, e.g., electron transport layer and hole transport layer, and only when the other functional layers achieve relatively ideal conditions in terms of, e.g., operation function, transport performance, stability, etc. can high device efficiency and life be obtained. A very important factor that determines the efficiency of a quantum dot device is that the electron transport rate and the hole transport rate are balanced. In a conventional device structure, the electron transport rate is generally greater than the hole transport rate, and it is difficult to achieve a balance between the two, resulting in a relatively low device efficiency and service life.

SUMMARY

In accordance with the disclosure, there is provided a composite material including a light-emitting quantum dot, and a first ligand and a second ligand bound on a surface of the light-emitting quantum dot. The first ligand includes an oil-soluble organic ligand, and the second ligand including a halogen ligand or a water-soluble ligand.

Also in accordance with the disclosure, there is provided a composite material preparation method including dispersing a cationic precursor and an oil-soluble organic ligand into a first solvent and heating at a first temperature to obtain a first mixture, dispersing an anionic precursor into a second solvent and heating at a second temperature to obtain a second mixture, and while heating the first mixture at a third temperature, injecting the second mixture for a growth of a light-emitting quantum dot to obtain a composite material. The cationic precursor includes a metal halide. The third temperature is higher than the first temperature and the second temperature.

Also in accordance with the disclosure, there is provided a quantum dot light-emitting diode including an anode, a cathode, and a quantum dot light-emitting layer disposed between the anode and the cathode. The quantum dot light-emitting layer includes a composite material including a light-emitting quantum dot, and a first ligand and a second ligand bound on a surface of the light-emitting quantum dot. The first ligand includes an oil-soluble organic ligand, and the second ligand including a halogen ligand or a water-soluble ligand.

Also in accordance with the disclosure, there is provided a composite material including a particle including an inorganic semiconductor nanocrystal, and an oil-soluble organic ligand and a water-soluble ligand bound on a surface of the particle.

DETAILED DESCRIPTION OF THE EMBODIMENTS

Figure 1:
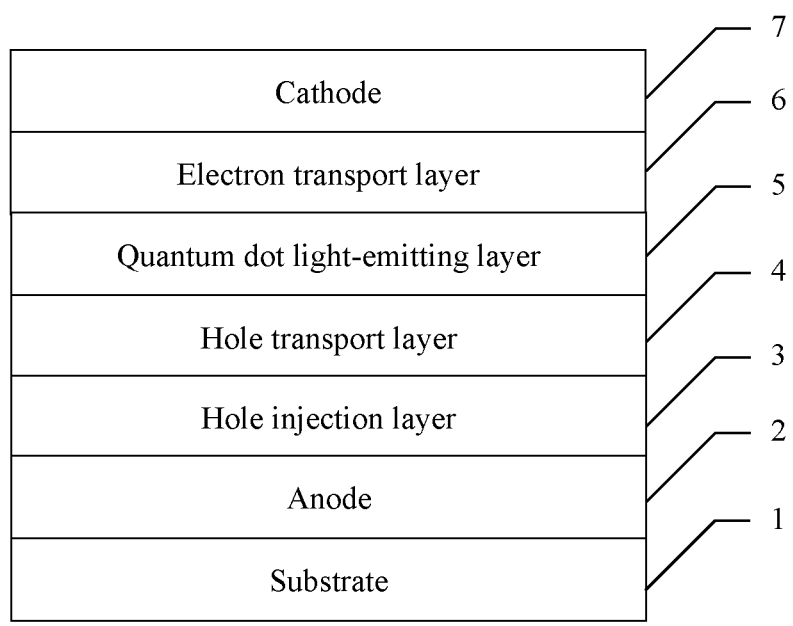
FIG. 1 is a schematic structural diagram of a quantum dot light-emitting diode according to the present disclosure.

The present disclosure provides a composite material and a quantum dot light-emitting diode. In order to make the purpose, technical solutions, and effects of the disclosure clearer and less ambiguous, the disclosure will be described in further detail below. It should be understood that the specific embodiments described herein are only for illustrative purpose, and are not intended to limit the present disclosure.

The present disclosure provides a composite material including a light-emitting quantum dot, and a halogen ligand and an oil-soluble organic ligand bound on the surface of the light-emitting quantum dot.

In the composite material provided by the present disclosure, the light-emitting quantum dot has the following mixed ligands on the surface thereof: the halogen ligand and the oil-soluble organic ligand that makes the composite material still oil-soluble. Compared with an existing oil-soluble composite material the surface of which is a merely oil-soluble organic ligand, in the oil-soluble composite material of the present disclosure, the halogen ligand may improve the electron transport performance and the transport rate of a carrier in a light-emitting layer, so that the electron transport rate and the hole transport rate in the light-emitting layer of a device are balanced, the light-emitting efficiency of the device is improved, the operation voltage is reduced, and the service life of the device is prolonged.

In some embodiments, the light-emitting quantum dot includes a II-VI quantum dot, a III-V quantum dot, or a IV-VI quantum dot. Here, "II," "III," "IV," "V," and "VI"

refer to a group II element, a group III element, a group IV element, a group V element, and a group VI element in the periodic table, respectively. Further, "II-VI" refers to a compound material including one or more group II elements and one or more group VI elements, "III-V" refers to a compound material including one or more group III elements and one or more group V elements, and "IV-VI" refers to a compound material including one or more group VI elements and one or more group VI elements. Specifically, the light-emitting quantum dot may include one or more of a single-core quantum dot and an alloy quantum dot of II-VI material, III-V material, and IV-VI material, and a core-shell type quantum dot of II-VI material, III-V material, and IV-VI material. For example, the single-core quantum dot and the alloy quantum dot of the II-VI material can be selected from CdSe, CdS, ZnSe, ZnS, CdTe, ZnTe, CdZnS, CdZnSe, CdZnTe, ZnSeS, ZnSeTe, ZnTeS, CdSeS, CdSeTe, CdTeS, CdZnSeS, CdZnSeTe, CdZnSTe, CdSeSTe, ZnSeSTe, and CdZnSeSTe, etc. The single-core quantum dot and the alloy quantum dot of the III-V material can be selected from InP, GaP, GaAs, InAs, InAsP, GaAsP, InGaP, InGaAs, and InGaAsP, etc. The single-core quantum dot and the alloy quantum dot of the IV-VI material can be selected from PbS, PbSe, PbTe, PbSeS, PbSeTe, and PbSTe, etc. The core-shell type quantum dot of II-VI material, III-V material, and IV-VI material can be selected from CdZnSe/ZnS, CdZnSeS/ZnS, CdTe/ZnS, CdZnSe/ZnS, CdZnSeS/ZnS, CdTe/ZnS, CdTe/CdSe, CdTe/ZnTe, CdSe/CdS, and CdSe/ZnS, etc.

In some embodiments, the light-emitting quantum dot includes a core-shell quantum dot with a III-V material or II-VI material as a core and a II-VI material as a shell. For example, the core or shell compound in the above describe core-shell quantum dot includes one or more of the following: CdSe, CdS, ZnSe, ZnS, CdTe, ZnTe, CdZnS, CdZnSe, CdZnTe, ZnSeS, ZnSeTe, ZnTeS, CdSeS, CdSeTe, CdTeS, CdZnSeS, CdZnSeTe, CdZnSTe, CdSeSTe, ZnSeSTe, CdZnSeSTe of the II-VI materials, InP, GaP, GaAs, InAs, InAsP, GaAsP, InGaP, InGaAs, InGaAsP of the III-V materials, and PbS, PbSe, PbTe, PbSeS, PbSeTe, PbSTe of the IV-VI materials.

In some embodiments, the light-emitting quantum dot includes a core-shell quantum dot with a II-VI material as a core and a II-VI material as a shell, that is, both the core material and the shell material are II-VI materials. A II-VI core-shell quantum dot has high light-emitting efficiency and narrow full width at half maximum. The II-VI core-shell quantum dot usually has a surface cation of $Zn^{2+}$ or $Cd^{2+}$ and a surface anion of $Se^{2-}$ or $S^{2-}$, and has lower energy barrier than ZnO, ZnS, or SnO, etc. selected for the electron transport layer. For example, the light-emitting quantum dot includes one or more of CdZnS/ZnS, CdZnSe/ZnSe, CdSeS/CdSeS/CdS, CdSe/CdZnSe/CdZnSe/ZnSe, CdZnSe/CdZnSe/ZnSe, CdS/CdZnS/CdZnS/ZnS, CdSe/ZnS, CdZnSe/ZnS, CdSe/CdS/ZnS, CdSe/ZnSe/ZnS, and CdZnSe/CdZnS/ZnS. The above described quantum dots have excellent light-emitting performance, thereby ensuring the effectiveness of electron transport in the quantum dot light-emitting materials.

In some embodiments, the halogen ligand includes one or more of a chloride ion, a bromide ion, and an iodide ion.

Further, in some embodiments, the halogen ligand is a chloride ion. Since the atomic radius of chlorine is small compared to bromine and iodine, when it is used as a surface ligand on the surface of the light-emitting quantum dot, the distance that an electron needs to travel during transport is small, which can improve the electron transportability.

In some embodiments, the oil-soluble organic ligand includes one or more of a linear organic ligand with a carbon number of eight or more, a secondary or tertiary amine having a side chain with a carbon number of four or more, a substituted or unsubstituted alkylaminophosphine, a substituted or unsubstituted alkoxyphosphine, a substituted or unsubstituted silylphosphine, and an alkylphosphine having a side chain with a carbon number of four or more, but not limited thereto.

Further, in some embodiments, the linear organic ligand with a carbon number of eight or more includes one or more of an organic carboxylic acid with a carbon number of eight or more, a thiol with a carbon number of eight or more, an organic phosphoric acid with a carbon number of eight or more, and a primary amine with a carbon number of eight or more, but not limited thereto. Specifically, the organic carboxylic acid with a carbon number of eight or more includes one or more of a caprylic acid, a nonanoic acid, a capric acid, an undecyl acid, a dodecyl acid, a tridecyl acid, a tetradecyl acid, a hexadecyl, and an octadecyl acid, etc. Specifically, the thiol with a carbon number of eight or more is selected form one or more of an octyl mercaptan, a nonyl mercaptan, a decyl mercaptan, a dodecyl mercaptan, a tetradecane mercaptan, a cetyl mercaptan, a stearyl mercaptan, a 1, 8-octane dithiol, and a 1, 10-decane dithiol, etc. Specifically, the organic phosphoric acid with a carbon number of eight or more includes one or more of a dodecylphosphonic acid, a tetradecylphosphoric acid, a hexadecylphosphoric acid, and an octadecylphosphoric acid, etc. Specifically, the primary amine with a carbon number of eight or more includes one or more of an octylamine, a nonylamine, a decylamine, a dodecylamine, a tetradecylamine, a hexadecylamine, and an octadecylamine, etc.

Further, in some embodiments, the secondary or tertiary amine having a side chain with a carbon number of four or more includes one or more of a dibutylamine, a dihexylamine, a diheptylamine, a dioctylamine, a dinonylamine, a didecylamine, a tributyl, a trihexylamine, a triheptylamine, a trioctylamine, a trinonylamine, and a tridecylamine, etc.

Further, in some embodiments, the substituted or unsubstituted alkylaminophosphine includes one or more of a tri (dimethylamino) phosphine, a tri (diethylamino) phosphine, a tri (dipropylamino) phosphine, a tri (dibutylamino) phosphine, a tri (dipentylamino) phosphine, a tri (dihexylamino) phosphine, a tri (diheptylamino) phosphine, a tri (dioctylamino) phosphine, and a dibenzyldiethylaminophosphine, but not limited thereto.

Further, in some embodiments, the substituted or unsubstituted alkoxyphosphine includes one or more of a diphenylmethoxyphosphine, a diphenylethoxyphosphine, a diphenylpropoxyphosphine, a diphenylbutoxyphosphine, and a chloro (diisopropylamino) methoxyphosphorus, but not limited thereto.

Further, in some embodiments, the substituted or unsubstituted silylphosphine includes one or more of a tris (trisilyl) phosphine, a tri (triethylsilyl) phosphine, a tri (tripropylsilyl) phosphine, a tri (tributylsilyl) phosphine, a tri (trispentasilyl) phosphine, a tri (trihexylsilyl) phosphine, a tri (triheptylsilyl) phosphine, and a tri (trioctylsilyl) phosphine, but not limited thereto.

Further, in some embodiments, the alkylphosphine having a side chain with a carbon number of four or more includes one or more of a tributylphosphine, a triheptylphosphine, and a trioctylphosphine, but not limited thereto.

In a specific embodiment, the oil-soluble organic ligand includes one or more of a thiol with a carbon number of eight or more, an organic phosphoric acid with a carbon number of eight or more, and a substituted or unsubstituted alkylaminophosphine. The organic phosphoric acid is bonded to cations on the surface of the light-emitting quantum dot by an ionic bond. The thiol is bonded to cations on the surface of the light-emitting quantum dot by a hydrogen bond. The alkylaminophosphine is bonded to cations on the surface of the light-emitting quantum dot by a lone electron pair of P and a hydrogen bond in —$NH_2$ simultaneously. These bonds are strong and hence the oil-soluble organic ligand is not easy to fall off, thereby ensuring the solubility and transportability of the composite material. Further, these types of ligands are not bonded to surface ions of the light-emitting quantum dot through a —OH, and hence will not undergo hydrolysis.

An embodiment of the present disclosure provides a method for preparing a composite material including the following processes.

A cationic precursor and a first oil-soluble organic ligand are dispersed into a solvent and heated at a first temperature to obtain a first mixture, where the cationic precursor is a metal halide.

An anionic precursor is dispersed into a solvent and heated at a second temperature to obtain a second mixture.

The first mixture is heated at a third temperature, and the second mixture is injected during the heating process for a growth of a light-emitting quantum dot to obtain a composite material, where the third temperature is higher than the first temperature and the second temperature.

In this embodiment, the cationic precursor containing a halogen reacts with the anionic precursor at high temperature to obtain a light-emitting quantum dot. The halogen ion in the cationic precursor containing the halogen and the first oil-soluble organic ligand are bound on the surface of the light-emitting quantum dot. Quantum dots with different ligands can be obtained by using the method of this embodiment. The prepared quantum dot has fewer surface defects, and by controlling the particle size (e.g., 10 nm-20 nm), can realize an emission peak in the visible band, which can be used as a light-emitting quantum dot. In the composite material obtained by the reaction of this method, the light-emitting quantum dot has the following mixed ligands on the surface thereof: the halogen ligand and the oil-soluble organic ligand that makes the composite material still oil-soluble. Compared with an existing oil-soluble composite material the surface of which is a merely oil-soluble organic ligand, in the composite material of the present disclosure, the halogen ligand may improve the electron transport performance and the transport rate of a carrier in a light-emitting layer, so that the electron transport rate and the hole transport rate in the light-emitting layer of a device are balanced, the light-emitting efficiency of the device is improved, the operation voltage is reduced, and the service life of the device is prolonged.

In some embodiments, the metal halide includes one or more of chloride, bromide, and iodide of cadmium element; and/or one or more of chloride, bromide, and iodide of lead element; For example, the metal halide includes one or more of $CdCl_2$, $CdBr_2$ and $CdI_2$; or one or more of $PbCl_2$, $PbBr_2$ and $PbI_2$, etc. Further, in some embodiments, the metal halide includes one or more of chloride, bromide, and iodide of zinc element. For example, the metal halide includes one or more of $ZnCl_2$, $ZnBr_2$ and $ZnI_2$. Further, in some embodiments, the anionic precursor can include one or more of S precursor, Se precursor, and Te precursor.

Specifically, the S precursor can include one or both of a sulfur element and a thiol with a carbon number of eight or more. The sulfur element is added in a form of sulfur-non-coordinating solvent after mixing with a non-coordinating solvent. The sulfur element is dispersed in the non-coordinating solvent to form a uniform liquid, which is convenient for a subsequent injection. It should be noted that the non-coordinating solvent can be used as a ligand to be bound on the surface of the light-emitting quantum dot in addition to dispersing the sulfur element. For example, the sulfur-non-coordinating solvent includes one or more of a sulfur-dodecene, a sulfur-tetradecene, a sulfur-hexadecene, a sulfur-octadecene, a sulfur-tributylphosphine, a sulfur-triheptylphosphine, a sulfur-trioctylphosphine. For example, the thiol with a carbon number of eight or more includes one or more of an octanethiol, a nonanethiol, a decanethiol, an undecanethiol, a dodecanethiol, a tridecanethiol, a tetradecanethiol, a pentadecylthiol, a hexadecanethiol, a heptadecanethiol and an octadecanethiol, etc.

Specifically, the Se precursor can be a selenium element. The selenium element is added in a form of selenium-non-coordinating solvent after mixing with a non-coordinating solvent. The selenium element is dispersed in the non-coordinating solvent to form a uniform liquid, which is convenient for a subsequent injection. It should be noted that the non-coordinating solvent can be used as a ligand to be bound on the surface of the light-emitting quantum dot in addition to dispersing the selenium element. For example, the selenium-non-coordinating solvent includes one or more of a selenium-dodecene, a selenium-tetradecene, a selenium-hexadecene, a selenium-octadecene, a selenium-tributylphosphine, a selenium-triheptylphosphine, and a selenium-trioctylphosphine.

Specifically, the Te precursor can be a tellurium element. The tellurium element is added in a form of tellurium-non-coordinating solvent after mixing with a non-coordinating solvent. The tellurium element is dispersed in the non-coordinating solvent to form a uniform liquid, which is convenient for a subsequent injection. It should be noted that the non-coordinating solvent can be used as a ligand to be bound on the surface of the light-emitting quantum dot in addition to dispersing the tellurium element. For example, the tellurium-non-coordinating solvent includes one or more of a tellurium-dodecene, a tellurium-tetradecene, a tellurium-hexadecene, and a tellurium-octadecene.

In some embodiments, the metal halide includes one or more of chloride, bromide, and iodide of indium element. For example, the metal halide includes one or more of $InCl_3$, $InBr_3$, and $InI_3$, etc.

Further, in some embodiments, the anionic precursor includes one or more of a precursor of P element and a precursor of As element. For example, the precursor of P element includes a tris (trimethylsilyl) phosphate, or alkyl phosphines (e.g., triethyl phosphine, tributyl phosphine, trioctyl phosphine, triphenyl phosphine, and tricyclohexyl phosphine), but is not limited thereto. The precursor of As element includes a at least one of an arsenic iodide, an arsenic bromide, an arsenic chloride, an arsenic oxide, and an arsenic sulfate, etc., but is not limited thereto.

In some embodiments, the first oil-soluble organic ligand includes one or more of an organic carboxylic acid with a carbon number of eight or more, an organic phosphoric acid with a carbon number of eight or more, a primary amine with a carbon number of eight or more, and a secondary or tertiary amine having a side chain with a carbon number of four or more.

In some embodiments, the first temperature is 110-190° C.

In some embodiments, the second temperature is 110-190° C.

In some embodiments, the particle size of the light-emitting quantum dot is larger than 10 nm. In the method of this embodiment, nucleation occurs at a relatively high temperature (i.e., the third temperature), and by controlling the particle size, the prepared inorganic semiconductor nanocrystal has fewer surface defects and may realize no emission peak in the visible band. The third temperature is 210-350° C. In some embodiments, the third temperature is 230-300° C.

In some embodiments, the first mixture is heated at a third temperature, and the second mixture is injected during the heating process for a growth of a light-emitting quantum dot. After the growth is completed, a third oil-soluble organic ligand is added during the cooling process, so that the third oil-soluble organic ligand is bound on the surface of the light-emitting quantum dot to obtain a composite material. The third oil-soluble organic ligand is a thiol with a carbon number of eight or more. The third temperature is higher than the first temperature and the second temperature.

An embodiment of the present disclosure provides a method for preparing a composite material including the following processes.

A cationic precursor is dispersed into a solvent and heated at a first temperature to obtain a first mixture, where the cationic precursor is a metal halide.

An anionic precursor and a second oil-soluble organic ligand are dispersed into a solvent and heated at a second temperature to obtain a second mixture.

The first mixture is heated at a third temperature, and the second mixture is injected during the heating process for a growth of a light-emitting quantum dot to obtain a composite material, where the third temperature is higher than the first temperature and the second temperature.

In this embodiment, the cationic precursor containing a halogen reacts with the anionic precursor at high temperature to obtain a light-emitting quantum dot. The halogen ion in the cationic precursor containing the halogen and the second oil-soluble organic ligand are bound on the surface of the light-emitting quantum dot. Quantum dots with different ligands can be obtained by using the method of this embodiment. The prepared quantum dot has fewer surface defects, and by controlling the particle size (e.g., 10 nm-20 nm), can realize an emission peak in the visible band, which can be used as a light-emitting quantum dot. In the composite material obtained by the reaction of this method, the light-emitting quantum dot has the following mixed ligands on the surface thereof: the halogen ligand and the oil-soluble organic ligand that makes the composite material still oil-soluble. Compared with an existing oil-soluble composite material the surface of which is a merely oil-soluble organic ligand, in the composite material of the present disclosure, the halogen ligand may improve the electron transport performance and the transport rate of a carrier in a light-emitting layer, so that the electron transport rate and the hole transport rate in the light-emitting layer of a device are balanced, the light-emitting efficiency of the device is improved, the operation voltage is reduced, and the service life of the device is prolonged.

In some embodiments, the metal halide includes one or more of chloride, bromide, and iodide of cadmium element; and/or one or more of chloride, bromide, and iodide of lead element; For example, the metal halide includes one or more of $CdCl_2$, $CdBr_2$ and $CdI_2$; or one or more of $PbCl_2$, $PbBr_2$ and $PbI_2$, etc. Further, in some embodiments, the metal halide includes one or more of chloride, bromide, and iodide of zinc element. For example, the metal halide includes one or more of $ZnCl_2$, $ZnBr_2$ and $ZnI_2$. Further, in some embodiments, the anionic precursor can include one or more of S precursor, Se precursor, and Te precursor.

Specifically, the S precursor can include one or both of a sulfur element and a thiol with a carbon number of eight or more. After the sulfur element is mixed with the second oil-soluble organic ligand, the formed S ion and/or thiol reacts with a metal ion in the cationic precursor at a high temperature to nucleate to obtain a light-emitting quantum dot. The halogen ion in the cationic precursor containing the halogen, and the second oil-soluble organic ligand are bound on the surface of the light-emitting quantum dot. For example, the thiol with a carbon number of eight or more includes one or more of an octanethiol, a nonanethiol, a decanethiol, an undecanethiol, a dodecanethiol, a tridecanethiol, a tetradecanethiol, a pentadecylthiol, a hexadecanethiol, a heptadecanethiol and an octadecanethiol, etc.

Specifically, the Se precursor can be a selenium element. After the selenium element is mixed with the second oil-soluble organic ligand, the formed Se ion reacts with a metal ion in the cationic precursor at a high temperature to nucleate to obtain a light-emitting quantum dot. The halogen ion in the cationic precursor containing the halogen, and the second oil-soluble organic ligand are bound on the surface of the light-emitting quantum dot.

Specifically, the Te precursor can be a tellurium element. After the tellurium element is mixed with the second oil-soluble organic ligand, the formed Te ion reacts with a metal ion in the cationic precursor at a high temperature to nucleate to obtain a light-emitting quantum dot. The halogen ion in the cationic precursor containing the halogen, and the second oil-soluble organic ligand are bound on the surface of the light-emitting quantum dot.

In some embodiments, the metal halide includes one or more of chloride, bromide, and iodide of indium element. For example, the metal halide includes one or more of $InCl_3$, $InBr_3$, and $InI_3$, etc.

Further, in some embodiments, the anionic precursor includes one or more of a precursor of P element and a precursor of As element. For example, the precursor of P element includes a tris (trimethylsilyl) phosphate, or alkyl phosphines (e.g., triethyl phosphine, tributyl phosphine, trioctyl phosphine, triphenyl phosphine, and tricyclohexyl phosphine), but not limited thereto. The precursor of As element includes a at least one of an arsenic iodide, an arsenic bromide, an arsenic chloride, an arsenic oxide, and an arsenic sulfate, etc., but is not limited thereto.

In some embodiments, the second oil-soluble organic ligand includes one or more of a substituted or unsubstituted alkylaminophosphine, a substituted or unsubstituted alkoxyphosphine, a substituted or unsubstituted silylphosphine, and an alkylphosphine having a side chain with a carbon number of four or more.

In some embodiments, the first temperature is 110-190° C.

In some embodiments, the second temperature is 110-190° C.

In some embodiments, the particle size of the light-emitting quantum dot is larger than 10 nm. In the method of this embodiment, nucleation occurs at a relatively high temperature (i.e., the third temperature), and by controlling the particle size, the prepared inorganic semiconductor nanocrystal has fewer surface defects and may realize no emission peak in the visible band. The third temperature is 210-350° C. In some embodiments, the third temperature is 230-300° C.

In some embodiments, the first mixture is heated at a third temperature, and the second mixture is injected during the heating process for a growth of a light-emitting quantum dot. After the growth is completed, a third oil-soluble organic ligand is added during the cooling process, so that the third oil-soluble organic ligand is bound on the surface of the light-emitting quantum dot to obtain a composite material. The third oil-soluble organic ligand is a thiol with a carbon number of eight or more. The third temperature is higher than the first temperature and the second temperature.

An embodiment of the present disclosure provides a method for preparing a composite material including the following processes.

A cationic precursor and a first oil-soluble organic ligand are dispersed into a solvent and heated at a first temperature to obtain a first mixture, where the cationic precursor is a metal halide.

An anionic precursor and a second oil-soluble organic ligand are dispersed into a solvent and heated at a second temperature to obtain a second mixture.

The first mixture is heated at a third temperature, and the second mixture is injected during the heating process for a growth of a light-emitting quantum dot to obtain a composite material, where the third temperature is higher than the first temperature and the second temperature.

In this embodiment, the cationic precursor containing a halogen reacts with the anionic precursor at high temperature to obtain a light-emitting quantum dot. The halogen ion in the cationic precursor containing the halogen, the first oil-soluble organic ligand, and the second oil-soluble organic ligand are bound on the surface of the light-emitting quantum dot. Quantum dots with different ligands can be obtained by using the method of this embodiment. The prepared quantum dot has fewer surface defects, and by controlling the particle size (e.g., 10 nm-20 nm), can realize an emission peak in the visible band, which can be used as a light-emitting quantum dot. In the composite material obtained by the reaction of this method, the light-emitting quantum dot has the following mixed ligands on the surface thereof: the halogen ligand and the oil-soluble organic ligand that makes the composite material still oil-soluble. Compared with an existing oil-soluble composite material the surface of which is a merely oil-soluble organic ligand, in the composite material of the present disclosure, the halogen ligand may improve the electron transport performance and the transport rate of a carrier in a light-emitting layer, so that the electron transport rate and the hole transport rate in the light-emitting layer of a device are balanced, the light-emitting efficiency of the device is improved, the operation voltage is reduced, and the service life of the device is prolonged.

In some embodiments, the metal halide includes one or more of chloride, bromide, and iodide of cadmium element; and/or one or more of chloride, bromide, and iodide of lead element; For example, the metal halide includes one or more of $CdCl_2$, $CdBr_2$ and $CdI_2$; or one or more of $PbCl_2$, $PbBr_2$ and $PbI_2$, etc. Further, in some embodiments, the metal halide includes one or more of chloride, bromide, and iodide of zinc element. For example, the metal halide includes one or more of $ZnCl_2$, $ZnBr_2$ and $ZnI_2$. Further, in some embodiments, the anionic precursor can include one or more of S precursor, Se precursor, and Te precursor.

Specifically, the S precursor can include one or both of a sulfur element and a thiol with a carbon number of eight or more. After the sulfur element is mixed with the second oil-soluble organic ligand, the formed S ion and/or thiol reacts with a metal ion in the cationic precursor at a high temperature to nucleate to obtain a light-emitting quantum dot. The halogen ion in the cationic precursor containing the halogen, the first oil-soluble organic ligand, and the second oil-soluble organic ligand are bound on the surface of the light-emitting quantum dot. For example, the thiol with a carbon number of eight or more includes one or more of an octanethiol, a nonanethiol, a decanethiol, an undecanethiol, a dodecanethiol, a tridecanethiol, a tetradecanethiol, a pentadecylthiol, a hexadecanethiol, a heptadecanethiol and an octadecanethiol, etc.

Specifically, the Se precursor can be a selenium element. After the selenium element is mixed with the second oil-soluble organic ligand, the formed Se ion reacts with a metal ion in the cationic precursor at a high temperature to nucleate to obtain a light-emitting quantum dot. The halogen ion in the cationic precursor containing the halogen, the first oil-soluble organic ligand, and the second oil-soluble organic ligand are bound on the surface of the light-emitting quantum dot.

Specifically, the Te precursor can be a tellurium element. After the tellurium element is mixed with the second oil-soluble organic ligand, the formed Te ion reacts with a metal ion in the cationic precursor at a high temperature to nucleate to obtain a light-emitting quantum dot. The halogen ion in the cationic precursor containing the halogen, the first oil-soluble organic ligand, and the second oil-soluble organic ligand are bound on the surface of the light-emitting quantum dot.

In some embodiments, the metal halide includes one or more of chloride, bromide, and iodide of indium element. For example, the metal halide includes one or more of $InCl_3$, $InBr_3$, and $InI_3$, etc.

Further, in some embodiments, the anionic precursor includes one or more of a precursor of P element and a precursor of As element. For example, the precursor of P element includes a tris (trimethylsilyl) phosphate, or alkyl phosphines (e.g., triethyl phosphine, tributyl phosphine, trioctyl phosphine, triphenyl phosphine, and tricyclohexyl phosphine), but not limited thereto. The precursor of As element includes a at least one of an arsenic iodide, an arsenic bromide, an arsenic chloride, an arsenic oxide, and an arsenic sulfate, etc., but is not limited thereto.

In some embodiments, the first oil-soluble organic ligand includes one or more of an organic carboxylic acid with a carbon number of eight or more, an organic phosphoric acid with a carbon number of eight or more, a primary amine with a carbon number of eight or more, and a secondary or tertiary amine having a side chain with a carbon number of four or more; and/or the second oil-soluble organic ligand includes one or more of a substituted or unsubstituted alkylaminophosphine, a substituted or unsubstituted alkoxyphosphine, a substituted or unsubstituted silylphosphine, and an alkylphosphine having a side chain with a carbon number of four or more.

In some embodiments, the first temperature is 110-190° C.; and/or the second temperature is 110-190° C.

In some embodiments, the particle size of the light-emitting quantum dot is larger than 10 nm. In the method of this embodiment, nucleation occurs at a relatively high temperature (i.e., the third temperature), and by controlling the particle size, the prepared inorganic semiconductor nanocrystal has fewer surface defects and may realize no emission peak in the visible band. The third temperature is 210-350° C. In some embodiments, the third temperature is 230-300° C.

In some embodiments, the first mixture is heated at a third temperature, and the second mixture is injected during the heating process for a growth of a light-emitting quantum dot. After the growth is completed, a third oil-soluble organic ligand is added during the cooling process, so that the third oil-soluble organic ligand is bound on the surface of the light-emitting quantum dot to obtain a composite material. The third oil-soluble organic ligand is a thiol with a carbon number of eight or more. The third temperature is higher than the first temperature and the second temperature.

An embodiment of the present disclosure provides a method for preparing a composite material including the following processes.

A cationic precursor is dispersed into a solvent and heated at a first temperature to obtain a first mixture, where the cationic precursor is a metal halide.

An anionic precursor is dispersed into a solvent and heated at a second temperature to obtain a second mixture.

The first mixture is heated at a third temperature, and the second mixture is injected during the heating process for a growth of a light-emitting quantum dot. After the crystal growth is completed, a third oil-soluble organic ligand is added during the cooling process, so that the third oil-soluble organic ligand is bound on the surface of the light-emitting quantum dot to obtain a composite material. The third oil-soluble organic ligand is a thiol with a carbon number of eight or more. The third temperature is higher than the first temperature and the second temperature.

In this embodiment, the cationic precursor containing a halogen reacts with the anionic precursor at high temperature to obtain a light-emitting quantum dot. The halogen ion in the cationic precursor containing the halogen and the third oil-soluble organic ligand are bound on the surface of the light-emitting quantum dot. Quantum dots with different ligands can be obtained by using the method of this embodiment. The prepared quantum dot has fewer surface defects, and by controlling the particle size (e.g., 10 nm-20 nm), can realize an emission peak in the visible band, which can be used as a light-emitting quantum dot. In the composite material obtained by the reaction of this method, the light-emitting quantum dot has the following mixed ligands on the surface thereof: the halogen ligand and the oil-soluble organic ligand that makes the composite material still oil-soluble. Compared with an existing oil-soluble composite material the surface of which is a merely oil-soluble organic ligand, in the composite material of the present disclosure, the halogen ligand may improve the electron transport performance and the transport rate of a carrier in a light-emitting layer, so that the electron transport rate and the hole transport rate in the light-emitting layer of a device are balanced, the light-emitting efficiency of the device is improved, the operation voltage is reduced, and the service life of the device is prolonged.

In some embodiments, the metal halide includes one or more of chloride, bromide, and iodide of cadmium element; and/or one or more of chloride, bromide, and iodide of lead element; For example, the metal halide includes one or more of $CdCl_2$, $CdBr_2$ and $CdI_2$; or one or more of $PbCl_2$, $PbBr_2$ and $PbI_2$, etc. Further, in some embodiments, the metal halide includes one or more of chloride, bromide, and iodide of zinc element. For example, the metal halide includes one or more of $ZnCl_2$, $ZnBr_2$ and $ZnI_2$. Further, in some embodiments, the anionic precursor can include one or more of S precursor, Se precursor, and Te precursor.

Specifically, the S precursor can include one or both of a sulfur element and a thiol with a carbon number of eight or more. The sulfur element is added in a form of sulfur-non-coordinating solvent after mixing with a non-coordinating solvent. The sulfur element is dispersed in the non-coordinating solvent to form a uniform liquid, which is convenient for a subsequent injection. It should be noted that the non-coordinating solvent can be used as a ligand to be bound on the surface of the light-emitting quantum dot in addition to dispersing the sulfur element. For example, the sulfur-non-coordinating solvent includes one or more of a sulfur-dodecene, a sulfur-tetradecene, a sulfur-hexadecene, and a sulfur-octadecene. For example, the thiol with a carbon number of eight or more includes one or more of an octanethiol, a nonanethiol, a decanethiol, an undecanethiol, a dodecanethiol, a tridecanethiol, a tetradecanethiol, a pentadecylthiol, a hexadecanethiol, a heptadecanethiol and an octadecanethiol, etc.

Specifically, the Se precursor can be a selenium element. The selenium element is added in a form of selenium-non-coordinating solvent after mixing with a non-coordinating solvent. The selenium element is dispersed in the non-coordinating solvent to form a uniform liquid, which is convenient for a subsequent injection. It should be noted that the non-coordinating solvent can be used as a ligand to be bound on the surface of the light-emitting quantum dot in addition to dispersing the selenium element. For example, the selenium-non-coordinating solvent includes one or more of a selenium-dodecene, a selenium-tetradecene, a selenium-hexadecene, a selenium-octadecene.

Specifically, the Te precursor can be a tellurium element. The tellurium element is added in a form of tellurium-non-coordinating solvent after mixing with a non-coordinating solvent. The tellurium element is dispersed in the non-coordinating solvent to form a uniform liquid, which is convenient for a subsequent injection. It should be noted that the non-coordinating solvent can be used as a ligand to be bound on the surface of the light-emitting quantum dot in addition to dispersing the tellurium element. For example, the tellurium-non-coordinating solvent includes one or more of a tellurium-dodecene, a tellurium-tetradecene, a tellurium-hexadecene, and a tellurium-octadecene.

In some embodiments, the metal halide includes one or more of chloride, bromide, and iodide of indium element. For example, the metal halide includes one or more of $InCl_3$, $InBr_3$, and $InI_3$, etc.

Further, in some embodiments, the anionic precursor includes one or more of a precursor of P element and a precursor of As element. For example, the precursor of P element includes a tris (trimethylsilyl) phosphate, or alkyl phosphines (e.g., triethyl phosphine, tributyl phosphine, trioctyl phosphine, triphenyl phosphine, and tricyclohexyl phosphine), but not limited thereto. The precursor of As element includes a at least one of an arsenic iodide, an arsenic bromide, an arsenic chloride, an arsenic oxide, and an arsenic sulfate, etc., but is not limited thereto.

In some embodiments, the first temperature is 110-190° C.; and/or the second temperature is 110-190° C.

In some embodiments, the particle size of the light-emitting quantum dot is larger than 10 nm. In the method of this embodiment, nucleation occurs at a relatively high temperature (i.e., the third temperature), and by controlling the particle size, the prepared inorganic semiconductor nanocrystal has fewer surface defects and may realize no emission peak in the visible band. The third temperature is 210-350° C. In some embodiments, the third temperature is 230-300° C.

The present disclosure provides a composite material including a light-emitting quantum dot, and an oil-soluble organic ligand and a water-soluble ligand bound on the surface of the light-emitting quantum dot.

It should be noted that the light-emitting quantum dot and the oil-soluble organic ligand are described in detail above, and will not be repeated here.

In some embodiments, the water-soluble ligand includes one or more of a halogen ion ligand, a mercapto alcohol with a carbon number less than eight, a mercaptoamine with a carbon number less than eight, and a mercapto acid with a carbon number less than eight, etc.

The present disclosure provides a composite material including a particle, and an oil-soluble organic ligand and a water-soluble ligand bound on the surface of the particle. The particle is an inorganic semiconductor nanocrystal.

It should be noted that the particle and the oil-soluble organic ligand are described below, and will not be repeated here.

In some embodiments, the water-soluble ligand includes one or more of a halogen ion ligand, a mercapto alcohol with a carbon number less than eight, a mercaptoamine with a carbon number less than eight, and a mercapto acid with a carbon number less than eight.

An embodiment of the present disclosure provides a quantum dot light-emitting diode including an anode, a cathode, and a quantum dot light-emitting layer disposed between the anode and the cathode. The quantum dot light-emitting layer includes a first quantum dot light-emitting layer with a composite material including a light-emitting quantum dot, and a halogen ligand and oil-soluble organic ligand which are bound on the surface of the light-emitting quantum dot.

In the composite material provided by the present disclosure, the light-emitting quantum dot has the following mixed ligands on the surface thereof: the halogen ligand and the oil-soluble organic ligand that makes the composite material still oil-soluble. Compared with an existing oil-soluble composite material the surface of which is a merely oil-soluble organic ligand, in the oil-soluble composite material of the present disclosure, the halogen ligand may improve the electron transport performance and the transport rate of a carrier in a light-emitting layer, so that the electron transport rate and the hole transport rate in the light-emitting layer of a device are balanced, the light-emitting efficiency of the device is improved, the operation voltage is reduced, and the service life of the device is prolonged.

It should be noted that the details of the composite material are described above, and will not be repeated here.

Consistent with embodiments of the disclosure, the quantum dot light-emitting diode can be in many forms, and can have a normal structure or a reversed structure. FIG. 1 schematically shows a quantum dot light-emitting diode having a normal structure. Specifically, as shown in FIG. 1, the quantum dot light-emitting diode includes a substrate 1, an anode 2, a hole injection layer 3, a hole transport layer 4, a quantum dot light-emitting layer 5, an electron transport layer 6, and a cathode 7 layered from bottom to top. The quantum dot light-emitting layer 5 includes a first quantum dot light-emitting layer with a composite material including a light-emitting quantum dot, and a halogen ligand and oil-soluble organic ligand which are bound on the surface of the light-emitting quantum dot. The structure of the quantum dot light-emitting layer 5 is described in detail below.

Figure 2:
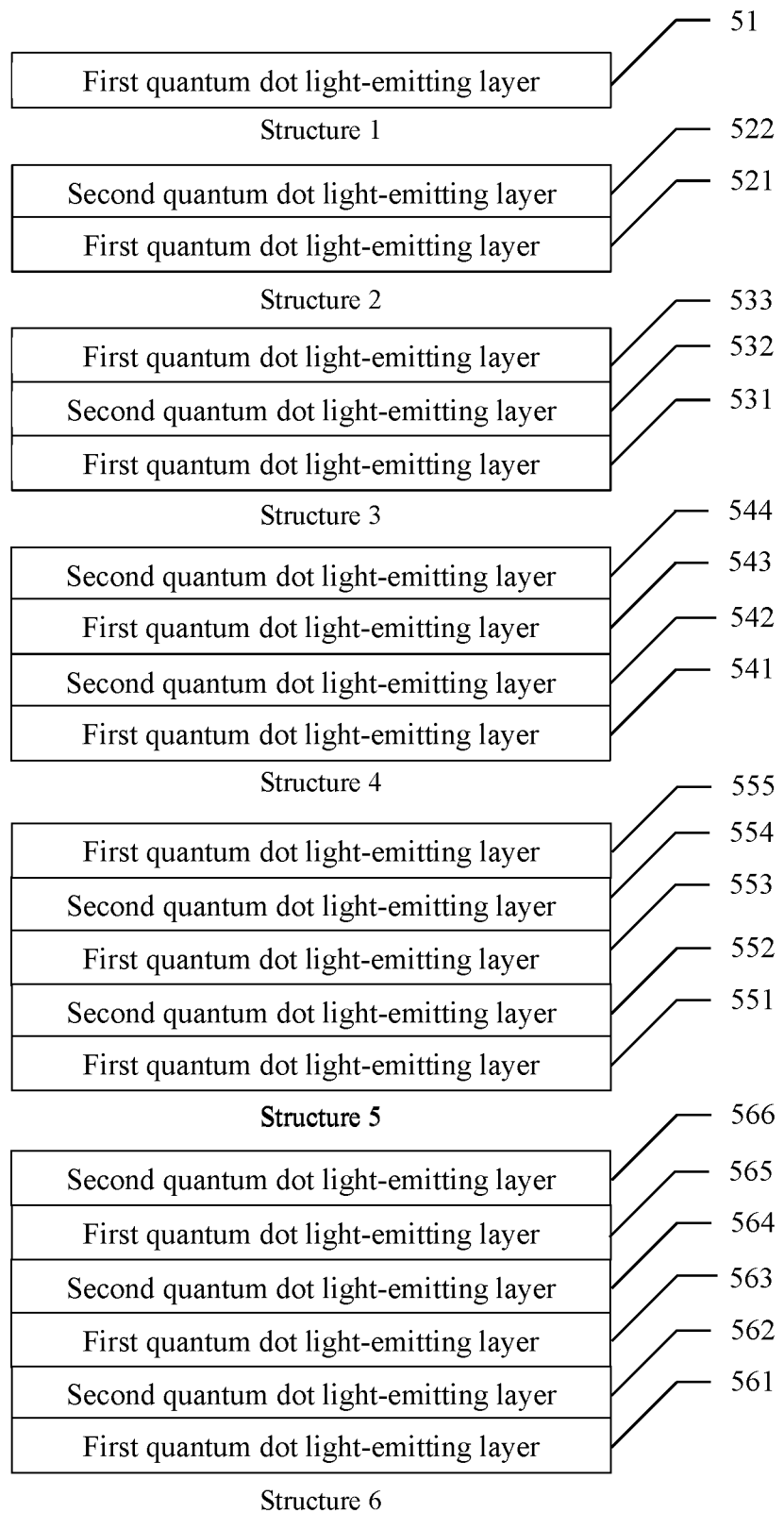
FIG. 2 is a schematic structural diagram of a quantum dot light-emitting layer in FIG. 1.

In some embodiments, the quantum dot light-emitting layer 5 is a first quantum dot light-emitting layer 51, as in structure 1 shown in FIG. 2. In the material of the first quantum dot light-emitting layer, the light-emitting quantum dot has the following mixed ligands on the surface thereof: the halogen ligand and the oil-soluble organic ligand, where the oil-soluble organic ligand makes the composite material still oil-soluble. Compared with an existing oil-soluble composite material, the surface of which includes merely an oil-soluble organic ligand, in the oil-soluble composite material of the present disclosure, the halogen ligand may improve the electron transport performance and the transport rate of a carrier in a light-emitting layer, so that the electron transport rate and the hole transport rate in the light-emitting layer of a device are balanced, the light-emitting efficiency of the device is improved, the operation voltage is reduced, and the service life of the device is prolonged.

In some embodiments, the quantum dot light-emitting layer further includes a second quantum dot light-emitting layer. The material of the second quantum dot light-emitting layer includes a water-soluble light-emitting quantum dot. In the quantum dot light-emitting layer of this embodiment, when the first quantum dot light-emitting layer is one layer and the second quantum dot light-emitting layer is one layer, the first quantum dot light-emitting layer and the second quantum dot light-emitting layer are stacked; when at least one of the first quantum dot light-emitting layer or the second quantum dot light-emitting layer has more than one layer, the first quantum dot light-emitting layer and the second quantum dot light-emitting layer are alternately stacked. In a device, water-soluble and oil-soluble functional layers need to be arranged alternately, i.e., neighboring functional layers cannot be both water-soluble or both oil-soluble. In addition, since the water-soluble electron transport material does not have an organic ligand on the surface, alternately stacking the water-soluble layer and the oil-soluble layer being in a same functional layer can further reduce the electron transport distance and improve the efficiency of the electron transport. In order to maintain a proper electron transport distance and keep the device not too thick, the total number of layers of the first quantum dot light-emitting layer and the second quantum dot light-emitting layer is 3-6. The cases where the total number of the first quantum dot light-emitting layer and the second quantum dot light-emitting layer is 2-6 will be described one by one with reference to FIG. 2. It should be noted that the total number of layers of the first quantum dot light-emitting layer and the total number of layers of the second quantum dot light-emitting layer may be same or different.

In some embodiments, as shown in structure 2 in FIG. 2, the quantum dot light-emitting layer 5 includes a two-layer structure of a first quantum dot light-emitting layer 521 and a second quantum dot light-emitting layer 522.

In some embodiments, as shown in structure 3 in FIG. 2, the quantum dot light-emitting layer 5 includes a three-layer structure of a first quantum dot light-emitting layer 531, a second quantum dot light-emitting layer 532, and a first quantum dot light-emitting layer 533 stacked sequentially.

In some embodiments, as shown in structure 4 in FIG. 2, the quantum dot light-emitting layer 5 includes a four-layer structure of a first quantum dot light-emitting layer 541, a second quantum dot light-emitting layer 542, a first quantum dot light-emitting layer 543, and a second quantum dot light-emitting layer 544 stacked sequentially.

In some embodiments, as shown in structure 5 in FIG. 2, the quantum dot light-emitting layer 5 includes five-layer structure of a first quantum dot light-emitting layer 551, a second quantum dot light-emitting layer 552, a first quantum dot light-emitting layer 553, a second quantum dot light-emitting layer 554, and a first quantum dot light-emitting layer 555 stacked sequentially.

In some embodiments, as shown in structure 6 in FIG. 2, the quantum dot light-emitting layer 5 includes a six-layer structure of a first quantum dot light-emitting layer 561, a second quantum dot light-emitting layer 562, a first quantum dot light-emitting layer 563, a second quantum dot light-emitting layer 564, a first quantum dot light-emitting layer 555, and a second quantum dot light-emitting layer 566 stacked sequentially.

In some embodiment, when the quantum dot light-emitting layer is a first quantum dot light-emitting layer, the quantum dot light-emitting diode further includes an electron transport layer stacked on the first quantum dot light-emitting layer. The first quantum dot light-emitting layer is disposed near the anode side and the electron transport layer is disposed near the cathode side. The electron transport layer includes a first electron transport layer and a second electron transport layer, where the first layer of second electron transport layer is stacked on the first quantum dot light-emitting layer, the first layer of first electron transport layer is stacked on the first layer of second electron transport layer, and each subsequent electron transport layer is stacked on each preceding different type of electron transport layer. The material of the first electron transport layer is a first composite material including a particle that is an inorganic semiconductor nanocrystal, and a first halogen ligand and a fourth oil-soluble organic ligand which are bound on the surface of the particle. The material of the second electron transport layer is a water-soluble electron transport material. In the first composite material of the embodiment, the particle has the following mixed ligands on the surface thereof: the first halogen ligand and the fourth oil-soluble organic ligand that makes the first composite material oil-soluble. In the first composite material, the first halogen ligand may improve the electron transport performance, and the fourth oil-soluble organic ligand may effectively reduce the electron transport rate, so that the electron transport performance of the material may be adjusted, thereby adjusting the electron transport rate and the hole transport rate in a device, and further improving the light-emitting efficiency of a light-emitting layer.

In this embodiment, with reference to FIG. 1, the electron transport layer 6 includes a first electron transport layer and a second electron transport layer, where the first layer of second electron transport layer is stacked on the first quantum dot light-emitting layer, the first layer of first electron transport layer is stacked on the first layer of second electron transport layer, and each subsequent electron transport layer is stacked on each preceding different type of electron transport layer. In a device, water-soluble and oil-soluble functional layers need to be arranged alternately, i.e., neighboring functional layers cannot be both water-soluble or both oil-soluble. In addition, since the water-soluble electron transport material does not have an organic ligand on the surface, alternately stacking the water-soluble layer and the oil-soluble layer being in a same functional layer can further reduce the electron transport distance and improve the efficiency of the electron transport. Further, in some embodiments, in order to maintain a proper electron transport distance and keep the device not too thick, the total number of layers of the first electron transport layer and the second electron transport layer is 3-6. The cases where the total number of the first electron transport layer and the second electron transport layer is 2-6 will be described one by one with reference to FIG. 3. It should be noted that the total number of layers of the first electron transport layer and the total number of layers of the second electron transport layer may be same or different.

Figure 3:
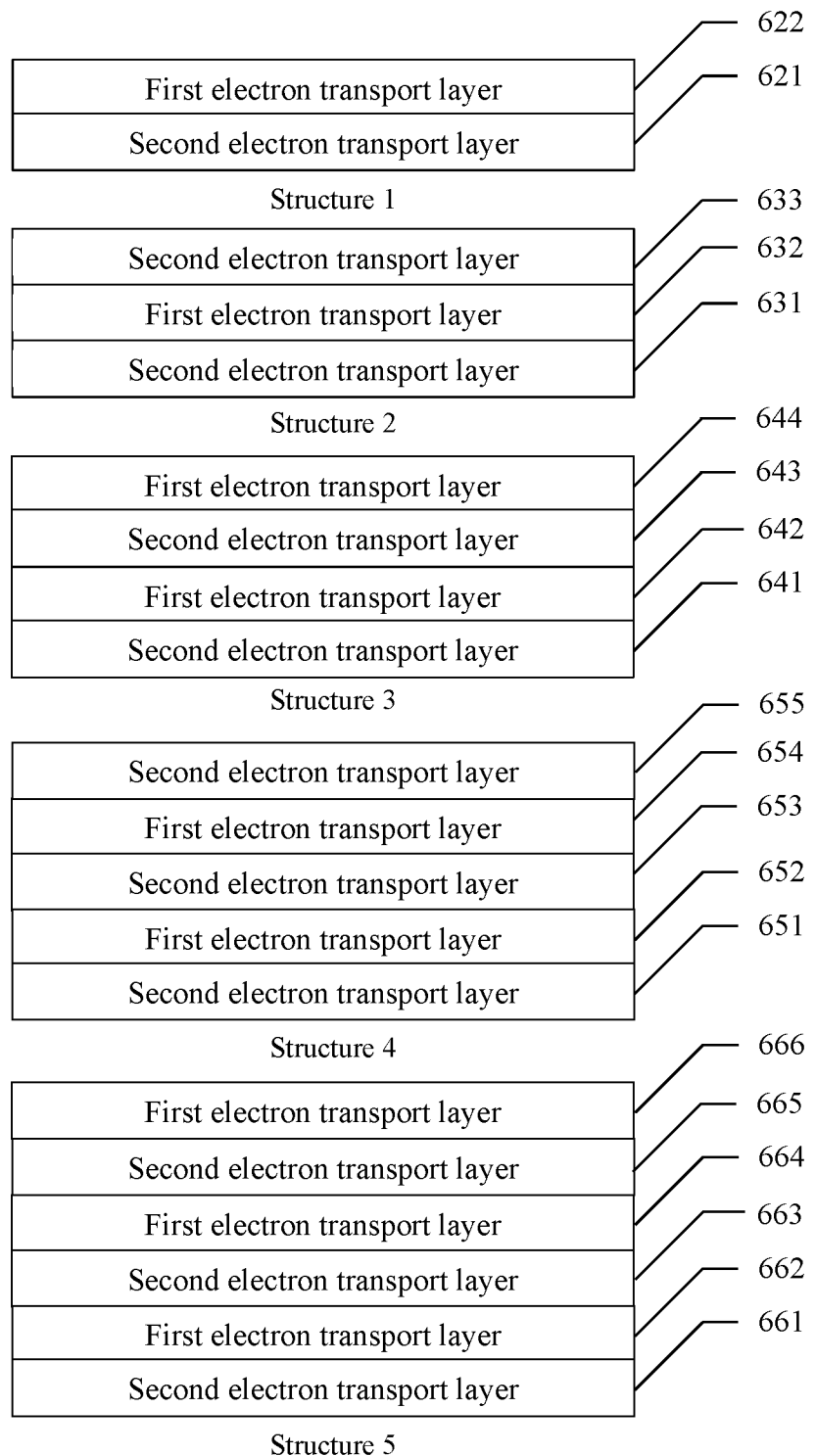
FIG. 3 is a schematic structural diagram of an electron transport layer in FIG. 1.

Further, in some embodiments, as shown in structure 1 in FIG. 3, a first layer of second electron transport layer 621 is stacked on a first quantum dot light-emitting layer, and a first layer of first electron transport layer 622 is stacked on the first layer of second electron transport layer 621 to form a two-layer stacked structure.

Further, in some embodiments, as shown in structure 2 in FIG. 3, a first layer of second electron transport layer 631 is stacked on a first quantum dot light-emitting layer, a first layer of first electron transport layer 632 is stacked on the first layer of second electron transport layer 631, and a second layer of second electron transport layer 633 is stacked on the first layer of first electron transport layer 632 to form a three-layer stacked structure.

Further, in some embodiments, as shown in structure 3 in FIG. 3, a first layer of second electron transport layer 641 is stacked on a first quantum dot light-emitting layer, a first layer of first electron transport layer 642 is stacked on the first layer of second electron transport layer 641, a second layer of second electron transport layer 643 is stacked on the first layer of first electron transport layer 642, and a second layer of first electron transport layer 644 is stacked on the second layer of second electron transport layer 643 to form a four-layer stacked structure.

Further, in some embodiments, as shown in structure 4 in FIG. 3, a first layer of second electron transport layer 651 is stacked on a first quantum dot light-emitting layer, a first layer of first electron transport layer 652 is stacked on the first layer of second electron transport layer 651, a second layer of second electron transport layer 653 is stacked on the first layer of first electron transport layer 652, a second layer of first electron transport layer 654 is stacked on the second layer of second electron transport layer 653, and a third layer of second electron transport layer 655 is stacked on the second layer of first electron transport layer 654 to form a five-layer stacked structure.

Further, in some embodiments, as shown in structure 5 in FIG. 3, a first layer of second electron transport layer 661 is stacked on a first quantum dot light-emitting layer, a first layer of first electron transport layer 662 is stacked on the first layer of second electron transport layer 661, a second layer of second electron transport layer 663 is stacked on the first layer of first electron transport layer 662, a second layer of first electron transport layer 664 is stacked on the second layer of second electron transport layer 663, a third layer of second electron transport layer 665 is stacked on the second layer of first electron transport layer 664, a third layer of first electron transport layer 666 is stacked on the third layer of second electron transport layer 665 to form a six-layer stacked structure.

In some embodiments, the quantum dot light-emitting layer includes a first quantum dot light-emitting layer and a second quantum dot light-emitting layer. The material of the first quantum dot light-emitting layer is a composite material including a light-emitting quantum dot, and a halogen ligand and oil-soluble organic ligand which are bound on the surface of the light-emitting quantum dot. The material of the second quantum dot light-emitting layer is a water-soluble light-emitting quantum dot. The quantum dot light-emitting diode further includes an electron transport layer stacked on the quantum dot light-emitting layer. The quantum dot light-emitting layer is disposed near the anode side and the electron transport layer is disposed near the cathode side. The electron transport layer includes at least one layer of a first electron transport layer and at least one layer of a second electron transport layer. The layer farthest from the anode in the quantum dot light-emitting layer is the first quantum dot light-emitting layer. The first layer of second electron transport layer is stacked on the first quantum dot light-emitting layer, the first layer of first electron transport layer is stacked on the first layer of second electron transport layer, and each subsequent electron transport layer is stacked on each preceding different type of electron transport layer. The material of the first electron transport layer is a first composite material including a particle that is an inorganic semiconductor nanocrystal, and a first halogen ligand and a fourth oil-soluble organic ligand which are bound on the surface of the particle. The material of the second electron transport layer is a water-soluble electron transport material. In a device, water-soluble and oil-soluble functional layers need to be arranged alternately, i.e., neighboring functional layers cannot be both water-soluble or both oil-soluble. In addition, since the water-soluble electron transport material does not have an organic ligand on the surface, alternately stacking the water-soluble layer and the oil-soluble layer being in a same functional layer can further reduce the electron transport distance and improve the efficiency of the electron transport.

Figure 4:
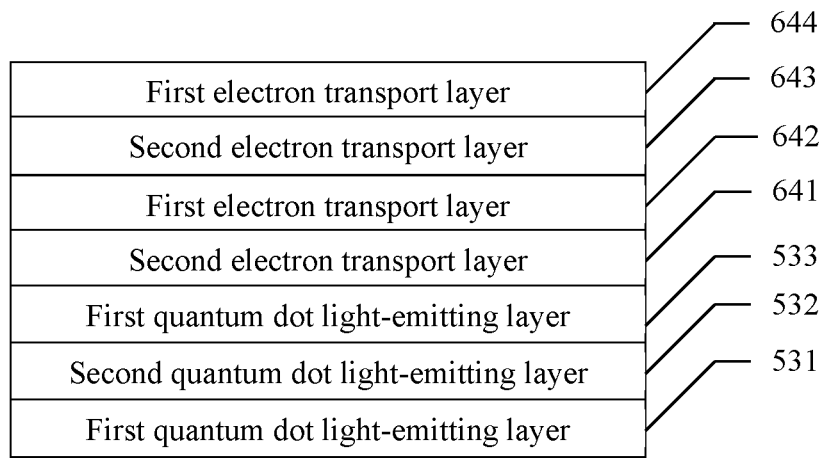
FIG. 4 is a schematic structural diagram of a combination of the quantum dot light-emitting layer and the electron transport layer in FIG. 1.

Further, in some embodiments, the total number of layers of the first quantum dot light-emitting layer and the second quantum dot light-emitting layer is 3-6, and the total number of layers of the first electron transport layer and the second electron transport layer is 3-6. For example, as shown in FIG. 4, the total number of layers of the first quantum dot light-emitting layer and the second quantum dot light-emitting layer is 3, and the total number of layers of the first electron transport layer and the second electron transport layer is 4. Specifically, the quantum dot light-emitting layer 5 is a three-layer structure including a first quantum dot light-emitting layer 531, a second quantum dot light-emitting layer 532 and a first quantum dot light-emitting layer 533 sequentially stacked. The electron transport layer 6 is a four-layer structure including a second electron transport layer 641, a first electron transport layer 642, a second electron transport layer 643, and a first electron transport layer 644 sequentially stacked, where the first layer of second electron transport layer 641 is stacked on the first quantum dot light-emitting layer 533, the first layer of first electron transport layer 642 is stacked on the first layer of second electron transport layer 641, the second layer of second electron transport layer 643 is stacked on the first layer of first electron transport layer 642, and the second layer of first electron transport layer 644 is stacked on the second layer of second electron transport layer 643.

In some embodiments, the quantum dot light-emitting layer includes a first quantum dot light-emitting layer and a second quantum dot light-emitting layer. The material of the first quantum dot light-emitting layer is a composite material including a light-emitting quantum dot, and a halogen ligand and oil-soluble organic ligand which are bound on the surface of the light-emitting quantum dot. The material of the second quantum dot light-emitting layer is a water-soluble light-emitting quantum dot. The quantum dot light-emitting diode further includes an electron transport layer stacked on the quantum dot light-emitting layer. The quantum dot light-emitting layer is disposed near the anode side and the electron transport layer is disposed near the cathode side. The electron transport layer includes at least one layer of a first electron transport layer and at least one layer of a second electron transport layer. The layer farthest from the anode in the quantum dot light-emitting layer is the second quantum dot light-emitting layer. The first layer of first electron transport layer is stacked on the second quantum dot light-emitting layer, the first layer of second electron transport layer is stacked on the first layer of first electron transport layer, and each subsequent electron transport layer is stacked on each preceding different type of electron transport layer. The material of the first electron transport layer is a first composite material including a particle that is an inorganic semiconductor nanocrystal, and a first halogen ligand and a fourth oil-soluble organic ligand which are bound on the surface of the particle. The material of the second electron transport layer is a water-soluble electron transport material. In a device, water-soluble and oil-soluble functional layers need to be arranged alternately, i.e., neighboring functional layers cannot be both water-soluble or both oil-soluble. In addition, since the water-soluble electron transport material does not have an organic ligand on the surface, alternately stacking the water-soluble layer and the oil-soluble layer being in a same functional layer can further reduce the electron transport distance and improve the efficiency of the electron transport.

Figure 5:
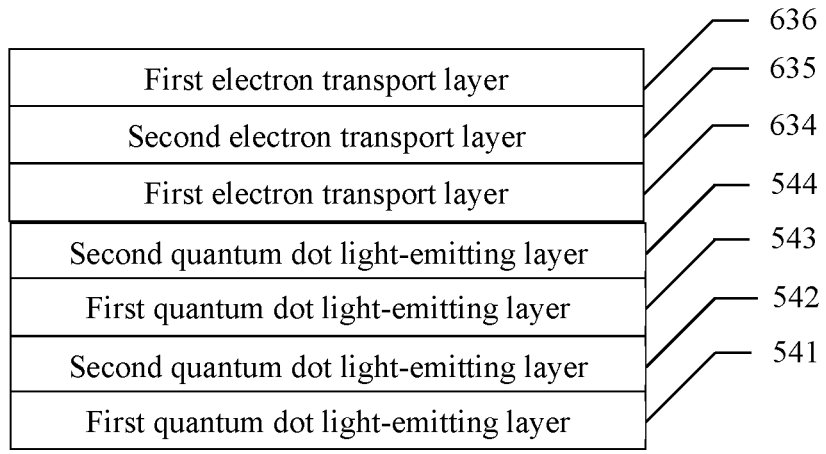
FIG. 5 is a schematic structural diagram of another combination of the quantum dot light-emitting layer and the electron transport layer in FIG. 1.

Further, in some embodiments, the total number of layers of the first quantum dot light-emitting layer and the second quantum dot light-emitting layer is 3-6, and the total number of layers of the first electron transport layer and the second electron transport layer is 3-6. For example, as shown in FIG. 5, the total number of layers of the first quantum dot light-emitting layer and the second quantum dot light-emitting layer is 4, and the total number of layers of the first electron transport layer and the second electron transport layer is 3. Specifically, the quantum dot light-emitting layer 5 is a four-layer structure including a first quantum dot light-emitting layer 541, a second quantum dot light-emitting layer 542, a first quantum dot light-emitting layer 543, and a second quantum dot light-emitting layer 544 sequentially stacked. The electron transport layer 6 is a three-layer structure including a first electron transport layer 634, a second electron transport layer 635, and a first electron transport layer 636 sequentially stacked, where the first layer of first electron transport layer 634 is stacked on the second quantum dot light-emitting layer 544, the first layer of second electron transport layer 635 is stacked on the first layer of first electron transport layer 634, and the second layer of first electron transport layer 636 is stacked on the first layer of second electron transport layer 635.

In some embodiments, the quantum dot light-emitting layer includes a first quantum dot light-emitting layer and a second quantum dot light-emitting layer. The material of the first quantum dot light-emitting layer is a composite material including a light-emitting quantum dot, and a halogen ligand and oil-soluble organic ligand which are bound on the surface of the light-emitting quantum dot. The material of the second quantum dot light-emitting layer is a water-soluble light-emitting quantum dot. The quantum dot light-emitting diode further includes an electron transport layer stacked on the quantum dot light-emitting layer. The quantum dot light-emitting layer is disposed near the anode side and the electron transport layer is disposed near the cathode side. The layer farthest from the anode in the quantum dot light-emitting layer is the second quantum dot light-emitting layer. The electron transport layer is one layer of a first electron transport layer stacked on the second quantum dot light-emitting layer. The material of the first electron transport layer is a first composite material including a particle that is an inorganic semiconductor nanocrystal, and a first halogen ligand and a fourth oil-soluble organic ligand which are bound on the surface of the particle. In a device, water-soluble and oil-soluble functional layers need to be arranged alternately, i.e., neighboring functional layers cannot be both water-soluble or both oil-soluble. In addition, since the water-soluble electron transport material does not have an organic ligand on the surface, alternately stacking the water-soluble layer and the oil-soluble layer being in a same functional layer can further reduce the electron transport distance and improve the efficiency of the electron transport.

Further, in some embodiments, the total number of layers of the first quantum dot light-emitting layer and the second quantum dot light-emitting layer is 3-6.

In some embodiments, the quantum dot light-emitting layer includes a first quantum dot light-emitting layer and a second quantum dot light-emitting layer. The material of the first quantum dot light-emitting layer is a composite material including a light-emitting quantum dot, and a halogen ligand and oil-soluble organic ligand which are bound on the surface of the light-emitting quantum dot. The material of the second quantum dot light-emitting layer is a water-soluble light-emitting quantum dot. The quantum dot light-emitting diode further includes an electron transport layer stacked on the quantum dot light-emitting layer. The quantum dot light-emitting layer is disposed near the anode side and the electron transport layer is disposed near the cathode side. The layer farthest from the anode in the quantum dot light-emitting layer is the first quantum dot light-emitting layer. The electron transport layer is one layer of a second electron transport layer stacked on the first quantum dot light-emitting layer that is farthest from the anode. The material of the second electron transport layer is a water-soluble electron transport material. In a device, water-soluble and oil-soluble functional layers need to be arranged alternately, i.e., neighboring functional layers cannot be both water-soluble or both oil-soluble. In addition, since the water-soluble electron transport material does not have an organic ligand on the surface, alternately stacking the water-soluble layer and the oil-soluble layer being in a same functional layer can further reduce the electron transport distance and improve the efficiency of the electron transport.

Further, in some embodiments, the total number of layers of the first quantum dot light-emitting layer and the second quantum dot light-emitting layer is 3-6.

Further, in some embodiments, the material of the second electron transport layer may include materials with good electron transport properties, e.g., including one or more of an n-type ZnO particle, a $TiO_2$ particle, a Ca particle, a Ba particle, a $ZrO_2$ particle, a CsF particle, a LiF particle, a $CsCO_3$ particle, and an Alq3 particle, etc. These water-soluble electron transport materials can be dispersed in water, methanol, ethanol, propanol, acetone, or another solution in the form of ions. The nanoparticle is 5-15 nm in size and has no surface ligand.

Further, in some embodiments, the material of the second quantum dot light-emitting layer is a quantum dot with a water-soluble ligand bound on the surface.

Further, in some embodiments, the water-soluble ligand includes one or more of a halogen ion ligand, a mercapto alcohol with a carbon number less than eight, a mercaptoamine with a carbon number less than eight, and a mercapto acid with a carbon number less than eight. As an example, the halogen ion ligand includes one or more of a chloride ion, a bromide ion, and an iodide ion. As an example, the mercapto alcohol with a carbon number less than eight includes one or more of 2-mercaptoethanol, 3-mercapto-1-propanol, 4-mercapto-1-butanol, 5-mercapto-1-pentanol, and 6-mercapto-1-hexanol, etc. As an example, the mercaptoamine with a carbon number less than eight includes one or more of 2-mercaptoethylamine, 3-mercaptopropylamine, 4-mercaptobutylamine, 5-mercaptopentamine, 6-mercaptohexylamine, and 2-amino-3-mercaptopropionic acid, etc. As an example, the mercapto acid with a carbon number less than eight includes one or more of 2-mercaptoacetic acid, 3-mercaptopropionic acid, 4-mercaptobutanoic acid, mercaptosuccinic acid, 6-mercaptohexanoic acid, 4-mercaptobenzoic acid and semicystine, etc.

It should be noted that in a quantum dot light-emitting diode, when the quantum dot light-emitting layer includes more than one second quantum dot light-emitting layers, the material of the second quantum dot light-emitting layer may be a same type or a plurality of different types.

Further, in some embodiments, the quantum dot includes one or more of Au, Ag, Cu, Pt, C, CdSe, CdS, CdTe, CdS, CdZnSe, CdSeS, PbSeS, ZnCdTe, CdS/ZnS, CdZnS/ZnS, CdZnSe/ZnSe, CdSeS/CdSeS/CdS, CdSe/CdZnSe/CdZnSe/ZnSe, CdZnSe/CdZnSe/ZnSe, CdS/CdZnS/CdZnS/ZnS, $NaYF_4$, $NaCdF_4$, CdZnSeS, CdSe/ZnS, CdZnSe/ZnS, CdSe/CdS/ZnS, CdSe/ZnSe/ZnS, CdZnSe/CdZnS/ZnS and InP/ZnS, etc.

In some embodiments, the substrate may be a substrate of rigid material, e.g., glass, etc., or a substrate of flexible material, e.g., one of PET or PI, etc.

In some embodiments, the anode may include one or more of indium-doped tin oxide (ITO), fluorine-doped tin oxide (FTO), antimony-doped tin oxide (ATO), and aluminum-doped zinc oxide (AZO), etc.

In some embodiments, the material of the hole transport layer may include one or more of NiO, CuO, CuS, TFB, PVK, Poly-TPD, TCTA, and CBP, etc. Furthermore, the thickness of the hole transport layer is 20-40 nm.

In some embodiments, the thickness of the quantum dot light-emitting layer is 20-60 nm.

In some embodiments, the cathode may include aluminum (Al) electrode, silver (Ag) electrode, and gold (Au) electrode, etc. Furthermore, the thickness of the cathode is 60-100 nm.

It should be noted that the quantum dot light-emitting diode of the present disclosure may further include one or more layers of the following functional layers: an electron blocking layer disposed between the quantum dot light-emitting layer and the electron transport layer, and an electron injection layer disposed between the electron transport layer and the cathode.

The first composite material in the embodiments of the present disclosure will be described in detail below.

The first composite material includes a particle that is an inorganic semiconductor nanocrystal, and a first halogen ligand and a fourth oil-soluble organic ligand which are bound on the surface of the particle.

In the first composite material of the embodiment, the particle has the following mixed ligands on the surface thereof: the first halogen ligand and the fourth oil-soluble organic ligand that makes the first composite material oil-soluble. In the oil-soluble first composite material, the first halogen ligand may improve the electron transport performance, and the fourth oil-soluble organic ligand may effectively reduce the electron transport rate, so that the electron transport performance of the material may be adjusted, thereby adjusting the electron transport rate and the hole transport rate in a device, and further improving the light-emitting efficiency of a light-emitting layer. The fourth oil-soluble organic ligand bound on the surface of the particle acts as passivating the surface and hence there are fewer surface defects.

In some embodiments, the first composite material has no emission in the visible band, thereby ensuring that the first composite material can be used as an electron transport material.

In some embodiments, the particle size of an inorganic semiconductor nanocrystal is 2-7 nm. The inorganic semiconductor nanocrystal has a small size and the particles are uniform. The particles have a good dispersibility in the solvent and the solution formed by dissolving the particles in the solvent is clear without a precipitation.

In some embodiments, the inorganic semiconductor nanocrystal is a metal oxide particle selected from a ZnO particle, a CdO particle, a SnO particle, or a GeO particle, but not limited thereto. In another embodiment, the inorganic semiconductor nanocrystal is a metal sulfide particle selected from a ZnS particle, a SnS particle, or a GeS particle, but not limited thereto. In the embodiments of the present disclosure, the inorganic semiconductor nanocrystal including the material described above has no emission in the visible band, and can be used as an electron transport material that does not affect the emission color of the light-emitting layer of a quantum dot device.

In some embodiments, the first halogen ligand includes one or more of a chloride ion, a bromide ion, and an iodide ion.

Further, in some embodiments, the first halogen ligand is a chloride ion. Since the atomic radius of chlorine is small compared to bromine and iodine, when it is used as a surface ligand on the surface of the light-emitting quantum dot, the distance that an electron needs to travel during transport is small, which can improve the electron transportability.

In some embodiments, the fourth oil-soluble organic ligand includes one or more of a linear organic ligand with a carbon number of eight or more, a secondary or tertiary amine having a side chain with a carbon number of four or more, a substituted or unsubstituted alkylaminophosphine, a substituted or unsubstituted alkoxyphosphine, a substituted or unsubstituted silylphosphine, and an alkylphosphine having a side chain with a carbon number of four or more, but not limited thereto. The specific types are described above and will not be repeated here. In a specific embodiment, the fourth oil-soluble organic ligand includes one or more of a thiol with a carbon number of eight or more, an organic phosphoric acid with a carbon number of eight or more, and a substituted or unsubstituted alkylaminophosphine. The organic phosphoric acid is bonded to cations on the surface of the inorganic semiconductor nanocrystal by an ionic bond. The thiol is bonded to cations on the surface of the inorganic semiconductor nanocrystal by a hydrogen bond. The alkylaminophosphine is bonded to cations on the surface of the inorganic semiconductor nanocrystal by a lone electron pair of P and a hydrogen bond in $—NH_2$ simultaneously. These bonds are strong and hence the oil-soluble organic ligand is not easy to fall off, thereby ensuring the solubility and transportability of the material of the first electron transport layer. Further, these types of ligands are not bonded to surface ions of the inorganic semiconductor nanocrystal through a —OH, and hence will not undergo hydrolysis.

In a specific embodiment, the fourth oil-soluble organic ligand is a substituted or unsubstituted alkylaminophosphine, and the particle is a metal sulfide particle. The substituted or unsubstituted alkylaminophosphine is bonded to cations on the surface of the particle by a lone electron pair of P and a hydrogen bond in $—NH_2$ simultaneously. Since an ionic bond of the first halogen ligand is strong, the bond between the alkylaminophosphine and the surface of the particle is strong and the oil-soluble organic ligand is not easy to fall off. In addition, when the alkylaminophosphine and the iodine ligand are bonded to the metal sulfide particle, no —OH is bonded to the surface of the metal sulfide particle, which will not cause hydrolysis or oxidation of the metal sulfide particle.

In a specific embodiment, the fourth oil-soluble organic ligand is an organic phosphoric acid with a carbon number of eight or more, and the particle is a metal oxide particle. The organic phosphoric acid is bonded to the metal oxide particle by an ionic bond that is relatively strong. The metal oxide particle is not directly bonded with —OH, and hence is not easy to hydrolyze and deteriorate.

In a specific embodiment, the fourth oil-soluble organic ligand is a thiol with a carbon number of eight or more, and the particle is a metal sulfide particle. The thiol is bonded to cations on the surface of the metal sulfide particle by a hydrogen bond that is relatively strong and not easy to fall off. In addition, when the thiol is bonded to the metal sulfide particle, no —OH is bonded to the surface of the metal sulfide particle, which will not cause hydrolysis or oxidation of the metal sulfide particle.

In some embodiments, the inorganic semiconductor nanocrystal includes a doped metal element. The presence of the fourth oil-soluble organic ligand can relatively greatly reduce the electron transport performance. On the other hand, doping with the metal element can reduce the injection barrier of the electron transport layer to the light-emitting layer or form excess free electrons, which can improve the electron transport performance to a certain extent. As such, the electron transport rate and hole transport rate in the device can be further adjusted and the light-emitting efficiency of the light-emitting layer can be further improved. In some embodiments, the doped metal element accounts for 0.5-10% of the inorganic semiconductor nanocrystal in terms of mass percentage.

In some embodiments, the doped metal element includes one or more of Mg, Mn, Al, Y, V, and Ni, but is not limited thereto.

Further, in some embodiments, the inorganic semiconductor nanocrystal includes a ZnO particle, a ZnS particle, or a SnO particle, and the doped metal element is Al, V, or Y. The HOMO energy levels of these inorganic semiconductor nanocrystals can better match the HOMO energy levels of the quantum dots in the light-emitting layer, and a doped ion can reduce the injection barrier of the electron transport layer to the light-emitting layer, thereby ensuring the effectiveness of the electron transport between the materials of the transport layer and the light-emitting layer. Specifically, the doped metal element is Y.

In some other embodiments, the material of the first quantum dot light-emitting layer may be a second composite material including a light-emitting quantum dot, and an oil-soluble organic ligand and a water-soluble ligand bound on the surface of the light-emitting quantum dot. The oil-soluble organic ligand makes the second composite material still oil-soluble. The light-emitting quantum dot has mixed ligands of the oil-soluble organic ligand and the water-soluble ligand on the surface, and can balance the electron transport rate and the hole transport rate in the light-emitting layer of a device and improve the carrier mobility of the light-emitting layer, thereby improving the light-emitting efficiency and service life of the device. The water-soluble ligand includes one or more of a halogen ion ligand, a mercapto alcohol with a carbon number less than eight, a mercaptoamine with a carbon number less than eight, and a mercapto acid with a carbon number less than eight. The specific types of the water-soluble ligand are described in detail above, and will not be repeated here. The specific types of the light-emitting quantum dot and the oil-soluble organic ligand are described in detail above, and will not be repeated here.

A preparation method of the second composite material in above described embodiment is described in detail below, including the following processes.

A light-emitting quantum dot solution including a light-emitting quantum dot and a first non-polar solvent is provided, where the light-emitting quantum dot has an oil-soluble organic ligand bound on the surface.

The light-emitting quantum dot solution is placed in an exchange medium to form a ligand exchange reaction system after it is filled into a dialysis bag, where the exchange medium includes a polar solvent, a second non-polar solvent and a water-solution ligand.

The oil-soluble organic ligand is caused to detach from the surface of the quantum dot and enter the exchange medium, and the water-soluble ligand in the exchange medium is caused to enter the dialysis bag to bind with the quantum dot.

The above described preparation method fills the light-emitting quantum dot solution into a dialysis bag and places the solution in an exchange medium, where the light-emitting quantum dot solution includes a light-emitting quantum dot, the light-emitting quantum dot has an oil-soluble organic ligand bound on the surface, and the exchange medium includes a polar solvent, a second non-polar solvent and a water-solution ligand. Due to a concentration difference of the ligand solution inside and outside the dialysis bag, the oil-soluble organic ligand originally on the surface of the light-emitting quantum dot in the dialysis bag partly enters the exchange medium outside the dialysis bag, and the water-soluble ligand in the exchange medium enters the dialysis bag and binds with the cations on the surface of the light-emitting quantum dot, and hence mixed ligands of an oil-soluble organic ligand and a water-soluble ligand is formed on the surface of the quantum dot. The light-emitting quantum dot that has undergone a ligand exchange has mixed ligands of the oil-soluble organic ligand and the water-soluble ligand on the surface, and can balance the electron transport rate and the hole transport rate in the light-emitting layer of a device and improve the carrier mobility of the light-emitting layer, thereby improving the light-emitting efficiency and service life of the device. In addition, the method is simple to operate, can effectively perform the ligand exchange, does not need cleaning after the exchange, and does not need an addition of a precipitating agent, which can ensure a yield and the light-emitting efficiency of the light-emitting quantum dot.

In some embodiments, the first non-polar solvent includes one or more of a chloroform, a carbon tetrachloride, a n-hexane, a cyclohexane, a heptane, an octane, a nonane, a decane, an undecane, a deca Dioxane, a petroleum ether, an anisole, a phenethyl ether, an epoxypropyl phenyl ether, a benzene, an o-dichlorobenzene, a p-dichlorobenzene, an o-xylene, a p-xylene, a n-octylbenzene, a n-hexylbenzene, a cyclohexylbenzene, a 1,2,4-trichlorobenzene, a 1,2,4-trimethylbenzene, a 1,2,4-triethylbenzene, and a 1,2,4-trimethoxybenzene, etc.

In some embodiments, the second non-polar solvent includes one or more of a chloroform, a carbon tetrachloride, a n-hexane, a cyclohexane, a heptane, an octane, a nonane, a decane, an undecane, a deca Dioxane, a petroleum ether, an anisole, a phenethyl ether, an epoxypropyl phenyl ether, a benzene, an o-dichlorobenzene, a p-dichlorobenzene, an o-xylene, a p-xylene, a n-octylbenzene, a n-hexylbenzene, a cyclohexylbenzene, a 1,2,4-trichlorobenzene, a 1,2,4-trimethylbenzene, a 1,2,4-triethylbenzene, and a 1,2,4-trimethoxybenzene, etc.

It should be noted that a type of the non-polar solvent selected for the first non-polar solvent and a type of the non-polar solvent selected for the second non-polar solvent may be the same or different.

In some embodiments, the polar solvent includes one or more of water, methanol, ethanol, propanol, butanol, formamide, methylformamide, methylacetamide, dimethylformamide, dimethylacetamide, propionamide, butanamide, asparagine, pyridineamide, salicylamide, tetrahydrofuran-2-carboxamide, and tetrahydrofuran, etc.

In some embodiments, at 20-70° C., after the oil-soluble organic ligand is detached from the surface of the quantum dot, the water-soluble ligand in the exchange medium is caused to enter the dialysis bag to bind with the quantum dot.

Further, in some embodiments, the temperature of the ligand exchange reaction system is 20-70° C. during the processes of detaching the oil-soluble organic ligand from the surface of the quantum dot and causing the water-soluble ligand in the exchange medium to enter the dialysis bag to bind with the quantum dot, and the material of the dialysis bag is polyvinylidene fluoride.

Further, in some embodiments, the particle size of the light-emitting quantum dot is larger than 3.5 nm, and the molecular weight cut-off of the dialysis bag is less than 3500 KD, hence a dialysis bag with the molecular weight cut-off of, e.g., 3500 KD can be used; or the particle size of the light-emitting quantum dot is larger than 5 nm, and the molecular weight cut-off of the dialysis bag is less than 7000 KD, hence a dialysis bag with the molecular weight cut-off of, e.g., 3500 KD or 7000 KD can be used; or the particle size of the light-emitting quantum dot is larger than 7 nm, and the molecular weight cut-off of the dialysis bag is less than 14000 KD, hence a dialysis bag with the molecular weight cut-off of, e.g., 3500 KD, 7000 KD, or 14000 KD can be used.

In some other embodiments, the material of the first electron transport layer may be a third composite material including a particle that is an inorganic semiconductor nanocrystal, and a fourth oil-soluble organic ligand and a water-soluble ligand bound on the surface of particle. The fourth oil-soluble organic ligand makes the third composite material still oil-soluble. The particle has mixed ligands of the oil-soluble organic ligand and the water-soluble ligand on the surface, and can balance the electron transport rate and the hole transport rate in the light-emitting layer of a device and improve the carrier mobility of the light-emitting layer, thereby improving the light-emitting efficiency and service life of the device. The water-soluble ligand includes one or more of a halogen ion ligand, a mercapto alcohol with a carbon number less than eight, a mercaptoamine with a carbon number less than eight, and a mercapto acid with a carbon number less than eight. The specific types of the water-soluble ligand are described in detail above, and will not be repeated here. The specific types of the particle and the fourth oil-soluble organic ligand are described in detail above, and will not be repeated here. The preparation method of the third composite material is the same as the preparation method of the second composite material except that the particle is used to replace the light-emitting quantum dot and the fourth oil-soluble organic ligand is used to replace the oil-soluble organic ligand.

An embodiment of the present disclosure also provides a method for preparing a quantum dot light-emitting diode with a normal structure as shown in FIG. 1, including, providing a substrate, forming an anode over the substrate, forming a hole transport layer over the anode, forming a quantum dot light-emitting layer over the hole transport layer, forming an electron transport layer over the quantum dot light-emitting layer, and forming a cathode over the electron transport layer, to obtain the quantum dot light-emitting diode.

The quantum dot light-emitting layer includes a first quantum dot light-emitting layer with a composite material including a light-emitting quantum dot, a halogen ligand and an oil-soluble organic ligand which are bound on the surface of the light-emitting quantum dot.

In the present disclosure, a method for preparing each layer may be a chemical method or a physical method. The chemical method includes but is not limited to one or more of a chemical vapor deposition method, a continuous ion layer adsorption and reaction method, an anodizing method, an electrolytic deposition method, and a co-precipitation. The physical method includes but is not limited to one or more of a solution method (e.g., spin coating, printing, blade coating, dip-pulling, dipping, spraying, roll coating, casting, slot coating, or strip coating, etc.), an evaporation method (e.g., thermal evaporation, electron beam evaporation, magnetron sputtering, or multi-arc ion coating, etc.), and a deposition method (e.g., physical vapor deposition, atomic layer deposition, or pulse laser deposition, etc.).

It should be noted that the method for preparing the composite material of this embodiment is described above, and will not be repeated here.

An embodiment of the present disclosure provides a method for preparing the first composite material including the following processes.

A cationic precursor and a fifth oil-soluble organic ligand are dispersed into a solvent and heated at a first temperature to obtain a first mixture, where the cationic precursor is a metal halide.

An anionic precursor is dispersed into a solvent and heated at a second temperature to obtain a second mixture, where the anionic precursor is an organic alcohol.

The first mixture is heated at a third temperature, and the second mixture is injected during the heating process for a crystal growth of an inorganic semiconductor nanocrystal to obtain the first composite material, where the third temperature is higher than the first temperature and the second temperature.

In this embodiment, the organic alcohol is used as the anionic precursor. The cationic precursor containing a halogen undergoes an alcoholysis reaction with the organic alcohol at high temperature to obtain a metal oxide semiconductor nanocrystal. The halogen ion in the cationic precursor containing the halogen and the fifth oil-soluble organic ligand are bound on the surface of the metal oxide semiconductor nanocrystal. With the method of this embodiment to nucleate at a high temperature and by controlling the particle size (e.g., 2-7 nm), the prepared inorganic semiconductor nanocrystal has fewer surface defects and no emission peak in the visible band, and does not interfere with the emission of the light-emitting layer in a device structure. The metal oxide semiconductor nanocrystal has the following mixed ligands on the surface thereof: the first halogen ligand and the fifth oil-soluble organic ligand that makes the first composite material oil-soluble. In the first composite material, the first halogen ligand can improve the electron transport performance, and the fifth oil-soluble organic ligand can effectively reduce the electron transport rate, so that the electron transport performance of the material may be adjusted, thereby adjusting the electron transport rate and the hole transport rate in the device, and hence improving the light-emitting efficiency of the light-emitting layer.

In some embodiments, the metal halide includes one or more of chloride, bromide, and iodide of zinc element; or one or more of chloride, bromide, and iodide of cadmium element; or one or more of chloride, bromide, and iodide of tin element; or one or more of chloride, bromide, and iodide of germanium element. For example, the metal halide can include one or more of $ZnCl_2$, $ZnBr_2$ and $ZnI_2$; or one or more of $CdCl_2$, $CdBr_2$ and $CdI_2$; or one or more of $SnCl_2$, $SnBr_2$ and $SnI_2$; or one or more of $GeCl_2$, $GeBr_2$ and $GeI_2$, etc.

Further, in some embodiments, the metal halide includes $ZnCl_2$, $CdCl_2$, $SnCl_2$, $GeCl_2$, etc. Since the atomic radius of chlorine is small compared to bromine and iodine, when it is used as a surface ligand on the surface of the particle, the distance that an electron needs to travel during transport is small, which can improve the electron transportability.

In some embodiments, the fifth oil-soluble organic ligand includes one or more of an organic carboxylic acid with a carbon number of eight or more, an organic phosphoric acid with a carbon number of eight or more, a primary amine with a carbon number of eight or more, and a secondary or tertiary amine having a side chain with a carbon number of four or more.

Further, in some embodiments, the fifth oil-soluble organic ligand is an organic phosphoric acid with a carbon number of eight or more. The organic phosphoric acid is bonded to the metal oxide particle by an ionic bond that is relatively strong. The metal oxide particle is not directly bonded with —OH, and hence is not easy to hydrolyze and deteriorate.

In some embodiments, the organic alcohol includes one or more of octanol, nonanol, decanol, undecanol, dodecanol, tridecanol, tetradecanol, pentadecyl alcohol, hexadecanol, heptadecyl alcohol, and stearyl alcohol, etc.

In some embodiments, the first temperature is 110-190° C.

In some embodiments, the second temperature is 110-190° C.

In this embodiment, the prepared inorganic semiconductor nanocrystal is a metal oxide particle selected from a ZnO particle, a CdO particle, a SnO particle, or a GeO particle, but not limited thereto. With the method of this embodiment to nucleate at a high temperature and by controlling the particle size (e.g., 2-7 nm), the prepared inorganic semiconductor nanocrystal has fewer surface defects and no emission peak in the visible band, and does not interfere with the emission of the light-emitting layer in a device structure. The third temperature is 210-350° C. In some embodiments, the third temperature is 230-300° C.

In some embodiments, the first mixture is heated at the third temperature, and the second mixture is injected during the heating process for a crystal growth of an inorganic semiconductor nanocrystal. After the crystal growth is completed, a seventh oil-soluble organic ligand is added during the cooling process, so that the seventh oil-soluble organic ligand is bound on the surface of the semiconductor nanocrystal to obtain the first composite material. The seventh oil-soluble organic ligand is a thiol with a carbon number of eight or more. The third temperature is higher than the first temperature and the second temperature.

In some embodiments, dispersing the cationic precursor and the fifth oil-soluble organic ligand into the solvent and heating at the first temperature to obtain the first mixture further includes, dispersing a doped metal salt, the cationic precursor and the fifth oil-soluble organic ligand into the solvent and heating at the first temperature to obtain the first mixture.

Further, in some embodiments, the doped metal salt includes one or more of a Mg salt, a Mn salt, an Al salt, a Y salt, a V salt and a Ni salt, but is not limited thereto. For example, the Mg salt may include one or more of $MgCl_2$, $MgI_2$, and $Mg(NO_3)_2$, but is not limited thereto; the Mn salt may include one or more of $MnCl_2$, $MnI_2$, and $Mn(NO_3)_2$, but is not limited thereto; the Al salt may include one or more of $AlCl_3$, $AlI_3$, and $Al(CH_3COO)_3$, but is not limited thereto; the Y salt may include one or more of $YCl_2$, $Y(CH_3COO)_2$, and $Y(NO_3)_2$, but is not limited thereto; the V salt may include one or more of $VCl_2$, $V(CH_3COO)_2$, and $V(NO_3)_2$, but is not limited thereto; the Ni salt may include one or more of $NiCl_2$, $Ni(CH_3COO)_2$, and $Ni(NO_3)_2$, but is not limited thereto.

Further, in some embodiments, in the first composite material, the inorganic semiconductor nanocrystal includes a ZnO particle or a SnO particle, and the doped metal element is Al, V, or Y. The HOMO energy levels of these inorganic semiconductor nanocrystals can better match the HOMO energy levels of the quantum dots in the light-emitting layer, and a doped ion can reduce the injection barrier of the electron transport layer to the light-emitting layer, thereby ensuring the effectiveness of the electron transport between the materials of the transport layer and the light-emitting layer. Specifically, the doped metal element is Y.

An embodiment of the present disclosure provides a method for preparing the first composite material including the following processes.

An embodiment of the present disclosure provides a method for preparing a composite material including the following processes.

A cationic precursor is dispersed into a solvent and heated at a first temperature to obtain a first mixture, where the cationic precursor is a metal halide.

An anionic precursor and a sixth oil-soluble organic ligand are dispersed into a solvent and heated at a second temperature to obtain a second mixture, where the anionic precursor is an organic alcohol.

The first mixture is heated at a third temperature, and the second mixture is injected during the heating process for a crystal growth of an inorganic semiconductor nanocrystal to obtain the first composite material, where the third temperature is higher than the first temperature and the second temperature.

In this embodiment, the organic alcohol is used as the anionic precursor. The cationic precursor containing a halogen undergoes an alcoholysis reaction with the organic alcohol at high temperature to obtain a metal oxide semiconductor nanocrystal. The halogen ion in the cationic precursor containing the halogen and the sixth oil-soluble organic ligand are bound on the surface of the metal oxide semiconductor nanocrystal. With the method of this embodiment to nucleate at a high temperature and by controlling the particle size (e.g., 2-7 nm), the prepared inorganic semiconductor nanocrystal has fewer surface defects and no emission peak in the visible band, and does not interfere with the emission of the light-emitting layer in a device structure. The metal oxide semiconductor nanocrystal has the following mixed ligands on the surface thereof: the first halogen ligand and the sixth oil-soluble organic ligand that makes the first composite material oil-soluble. In the first composite material, the first halogen ligand can improve the electron transport performance, and the sixth oil-soluble organic ligand can effectively reduce the electron transport rate, so that the electron transport performance of the material may be adjusted, thereby adjusting the electron transport rate and the hole transport rate in the device, and hence improving the light-emitting efficiency of the light-emitting layer.

In some embodiments, the metal halide includes one or more of chloride, bromide, and iodide of zinc element; or one or more of chloride, bromide, and iodide of cadmium element; or one or more of chloride, bromide, and iodide of tin element; or one or more of chloride, bromide, and iodide of germanium element. For example, the metal halide can include one or more of $ZnCl_2$, $ZnBr_2$ and $ZnI_2$; or one or more of $CdCl_2$, $CdBr_2$ and $CdI_2$; or one or more of $SnCl_2$, $SnBr_2$ and $SnI_2$; or one or more of $GeCl_2$, $GeBr_2$ and $GeI_2$, etc.

Further, in some embodiments, the metal halide includes $ZnCl_2$, $CdCl_2$, $SnCl_2$, $GeCl_2$, etc. Since the atomic radius of chlorine is small compared to bromine and iodine, when it is used as a surface ligand on the surface of the particle, the distance that an electron needs to travel during transport is small, which can improve the electron transportability.

In some embodiments, the sixth oil-soluble organic ligand includes one or more of a substituted or unsubstituted alkylaminophosphine, a substituted or unsubstituted alkoxyphosphine, a substituted or unsubstituted silylphosphine, and an alkylphosphine having a side chain with a carbon number of four or more.

In some embodiments, the organic alcohol includes one or more of octanol, nonanol, decanol, undecanol, dodecanol, tridecanol, tetradecanol, pentadecyl alcohol, hexadecanol, heptadecyl alcohol, and stearyl alcohol, etc.

In some embodiments, the first temperature is 110-190° C.

In some embodiments, the second temperature is 110-190° C.

In this embodiment, the prepared inorganic semiconductor nanocrystal is a metal oxide particle selected from a ZnO particle, a CdO particle, a SnO particle, or a GeO particle, but not limited thereto. With the method of this embodiment to nucleate at a high temperature and by controlling the particle size (e.g., 2-7 nm), the prepared inorganic semiconductor nanocrystal has fewer surface defects and no emission peak in the visible band, and does not interfere with the emission of the light-emitting layer in a device structure. The third temperature is 210-350° C. In some embodiments, the third temperature is 230-300° C.

In some embodiments, the first mixture is heated at the third temperature, and the second mixture is injected during the heating process for a crystal growth of an inorganic semiconductor nanocrystal. After the crystal growth is completed, a seventh oil-soluble organic ligand is added during the cooling process, so that the seventh oil-soluble organic ligand is bound on the surface of the semiconductor nanocrystal to obtain the first composite material. The seventh oil-soluble organic ligand is a thiol with a carbon number of eight or more. The third temperature is higher than the first temperature and the second temperature.

In some embodiments, dispersing the cationic precursor into the solvent and heating at the first temperature to obtain the first mixture further includes, dispersing a doped metal salt and the cationic precursor into the solvent and heating at the first temperature to obtain the first mixture.

Further, in some embodiments, the doped metal salt includes one or more of a Mg salt, a Mn salt, an Al salt, a Y salt, a V salt and a Ni salt, but is not limited thereto. For example, the Mg salt may include one or more of $MgCl_2$, $MgI_2$, and $Mg(NO_3)_2$, but is not limited thereto; the Mn salt may include one or more of $MnCl_2$, $MnI_2$, and $Mn(NO_3)_2$, but is not limited thereto; the Al salt may include one or more of $AlCl_3$, $AlI_3$, and $Al(CH_3COO)_3$, but is not limited thereto; the Y salt may include one or more of $YCl_2$, $Y(CH_3COO)_2$, and $Y(NO_3)_2$, but is not limited thereto; the V salt may include one or more of $VCl_2$, $V(CH_3COO)_2$, and $V(NO_3)_2$, but is not limited thereto; the Ni salt may include one or more of $NiCl_2$, $Ni(CH_3COO)_2$, and $Ni(NO_3)_2$, but is not limited thereto.

Further, in some embodiments, in the first composite material, the inorganic semiconductor nanocrystal includes a ZnO particle or a SnO particle, and the doped metal element is Al, V, or Y. The HOMO energy levels of these inorganic semiconductor nanocrystals can better match the HOMO energy levels of the quantum dots in the light-emitting layer, and a doped ion can reduce the injection barrier of the electron transport layer to the light-emitting layer, thereby ensuring the effectiveness of the electron transport between the materials of the transport layer and the light-emitting layer. Specifically, the doped metal element is Y.

An embodiment of the present disclosure provides a method for preparing the first composite material including the following processes.

A cationic precursor and a fifth oil-soluble organic ligand are dispersed into a solvent and heated at a first temperature to obtain a first mixture, where the cationic precursor is a metal halide.

An anionic precursor and a sixth oil-soluble organic ligand are dispersed into a solvent and heated at a second temperature to obtain a second mixture, where the anionic precursor is an organic alcohol.

The first mixture is heated at a third temperature, and the second mixture is injected during the heating process for a crystal growth of an inorganic semiconductor nanocrystal to obtain the first composite material, where the third temperature is higher than the first temperature and the second temperature.

In this embodiment, the organic alcohol is used as the anionic precursor. The cationic precursor containing a halogen undergoes an alcoholysis reaction with the organic alcohol at high temperature to obtain a metal oxide semiconductor nanocrystal. The halogen ion in the cationic precursor containing the halogen, the fifth oil-soluble organic ligand and the sixth oil-soluble organic ligand are bound on the surface of the metal oxide semiconductor nanocrystal. With the method of this embodiment to nucleate at a high temperature and by controlling the particle size (e.g., 2-7 nm), the prepared inorganic semiconductor nanocrystal has fewer surface defects and no emission peak in the visible band, and does not interfere with the emission of the light-emitting layer in a device structure. The metal oxide semiconductor nanocrystal has the following mixed ligands on the surface thereof: the first halogen ligand, the fifth oil-soluble organic ligand and the sixth oil-soluble organic ligand that make the first composite material oil-soluble. In the first composite material, the first halogen ligand can improve the electron transport performance, and the fifth oil-soluble organic ligand and the sixth oil-soluble organic ligand can effectively reduce the electron transport rate, so that the electron transport performance of the material may be adjusted, thereby adjusting the electron transport rate and the hole transport rate in the device, and hence improving the light-emitting efficiency of the light-emitting layer.

In some embodiments, the metal halide includes one or more of chloride, bromide, and iodide of zinc element; or one or more of chloride, bromide, and iodide of cadmium element; or one or more of chloride, bromide, and iodide of tin element; or one or more of chloride, bromide, and iodide of germanium element. For example, the metal halide can include one or more of $ZnCl_2$, $ZnBr_2$ and $ZnI_2$; or one or more of $CdCl_2$, $CdBr_2$ and $CdI_2$; or one or more of $SnCl_2$, $SnBr_2$ and $SnI_2$; or one or more of $GeCl_2$, $GeBr_2$ and $GeI_2$, etc.

Further, in some embodiments, the metal halide includes $ZnCl_2$, $CdCl_2$, $SnCl_2$, $GeCl_2$, etc. Since the atomic radius of chlorine is small compared to bromine and iodine, when it is used as a surface ligand on the surface of the particle, the distance that an electron needs to travel during transport is small, which can improve the electron transportability.

In some embodiments, the fifth oil-soluble organic ligand includes one or more of an organic carboxylic acid with a carbon number of eight or more, an organic phosphoric acid with a carbon number of eight or more, a primary amine with a carbon number of eight or more, and a secondary or tertiary amine having a side chain with a carbon number of four or more; and/or the sixth oil-soluble organic ligand includes one or more of a substituted or unsubstituted alkylaminophosphine, a substituted or unsubstituted alkoxyphosphine, a substituted or unsubstituted silylphosphine, and an alkylphosphine having a side chain with a carbon number of four or more.

Further, in some embodiments, the fifth oil-soluble organic ligand is an organic phosphoric acid with a carbon number of eight or more, and the sixth oil-soluble organic ligand is a substituted or unsubstituted alkylaminophosphine. The organic phosphoric acid is bonded to cations on the surface of the inorganic semiconductor nanocrystal by an ionic bond. The alkylaminophosphine is bonded to cations on the surface of the inorganic semiconductor nanocrystal by a lone electron pair of P and a hydrogen bond in $-NH_2$ simultaneously. These two bonds are strong and hence the oil-soluble organic ligand is not easy to fall off, thereby ensuring the solubility and transportability of the composite material. Further, these two types of ligands are not bonded to surface ions of the inorganic semiconductor nanocrystal through a —OH, and hence will not undergo hydrolysis.

In some embodiments, the organic alcohol includes one or more of octanol, nonanol, decanol, undecanol, dodecanol, tridecanol, tetradecanol, pentadecyl alcohol, hexadecanol, heptadecyl alcohol, and stearyl alcohol, etc.

In some embodiments, the first temperature is 110-190° C.

In some embodiments, the second temperature is 110-190° C.

In this embodiment, the prepared inorganic semiconductor nanocrystal is a metal oxide particle selected from a ZnO particle, a CdO particle, a SnO particle, or a GeO particle, but not limited thereto. With the method of this embodiment to nucleate at a high temperature and by controlling the particle size (e.g., 2-7 nm), the prepared inorganic semiconductor nanocrystal has fewer surface defects and no emission peak in the visible band, and does not interfere with the emission of the light-emitting layer in a device structure. The third temperature is 210-350° C. In some embodiments, the third temperature is 230-300° C.

In some embodiments, the first mixture is heated at the third temperature, and the second mixture is injected during the heating process for a crystal growth of an inorganic semiconductor nanocrystal. After the crystal growth is completed, a seventh oil-soluble organic ligand is added during the cooling process, so that the seventh oil-soluble organic ligand is bound on the surface of the semiconductor nanocrystal to obtain the first composite material. The seventh oil-soluble organic ligand is a thiol with a carbon number of eight or more. In this embodiment, the organic alcohol is used as the anionic precursor. The cationic precursor containing a halogen undergoes an alcoholysis reaction with the organic alcohol at high temperature to obtain a metal oxide semiconductor nanocrystal. The halogen ion in the cationic precursor containing the halogen, the fifth oil-soluble organic ligand, the sixth oil-soluble organic ligand, and the seventh oil-soluble organic ligand are bound on the surface of the metal oxide semiconductor nanocrystal.

Further, in some embodiments, the fifth oil-soluble organic ligand is an organic phosphoric acid with a carbon number of eight or more, the sixth oil-soluble organic ligand is a substituted or unsubstituted alkylaminophosphine, and the seventh oil-soluble organic ligand is a thiol with a carbon number of eight or more. The organic phosphoric acid is bonded to cations on the surface of the inorganic semiconductor nanocrystal by an ionic bond. The thiol is bonded to cations on the surface of the inorganic semiconductor nanocrystal by a hydrogen bond. The alkylaminophosphine is bonded to cations on the surface of the inorganic semiconductor nanocrystal by a lone electron pair of P and a hydrogen bond in $—NH_2$ simultaneously. These bonds are strong and hence the oil-soluble organic ligand is not easy to fall off, thereby ensuring the solubility and transportability of the first composite material. Further, these types of ligands are not bonded to surface ions of the inorganic semiconductor nanocrystal through a $—OH$, and hence will not undergo hydrolysis.

In some embodiments, dispersing the cationic precursor and the fifth oil-soluble organic ligand into the solvent and heating at the first temperature to obtain the first mixture further includes, dispersing a doped metal salt, the cationic precursor and the fifth oil-soluble organic ligand into the solvent and heating at the first temperature to obtain the first mixture.

Further, in some embodiments, the doped metal salt includes one or more of a Mg salt, a Mn salt, an Al salt, a Y salt, a V salt and a Ni salt, but is not limited thereto. For example, the Mg salt may include one or more of $MgCl_2$, $MgI_2$, and $Mg(NO_3)_2$, but is not limited thereto; the Mn salt may include one or more of $MnCl_2$, $MnI_2$, and $Mn(NO_3)_2$, but is not limited thereto; the Al salt may include one or more of $AlCl_3$, $AlI_3$, and $Al(CH_3COO)_3$, but is not limited thereto; the Y salt may include one or more of $YCl_2$, $Y(CH_3COO)_2$, and $Y(NO_3)_2$, but is not limited thereto; the V salt may include one or more of $VCl_2$, $V(CH_3COO)_2$, and $V(NO_3)_2$, but is not limited thereto; the Ni salt may include one or more of $NiCl_2$, $Ni(CH_3COO)_2$, and $Ni(NO_3)_2$, but is not limited thereto.

Further, in some embodiments, in the first composite material, the inorganic semiconductor nanocrystal includes a ZnO particle or a SnO particle, and the doped metal element is Al, V, or Y. The HOMO energy levels of these inorganic semiconductor nanocrystals can better match the HOMO energy levels of the quantum dots in the light-emitting layer, and a doped ion can reduce the injection barrier of the electron transport layer to the light-emitting layer, thereby ensuring the effectiveness of the electron transport between the materials of the transport layer and the light-emitting layer. Specifically, the doped metal element is Y.

An embodiment of the present disclosure provides a method for preparing the first composite material including the following processes.

A cationic precursor is dispersed into a solvent and heated at a first temperature to obtain a first mixture, where the cationic precursor is a metal halide.

An anionic precursor is dispersed into a solvent and heated at a second temperature to obtain a second mixture, where the anionic precursor is an organic alcohol.

The first mixture is heated at a third temperature, and the second mixture is injected during the heating process for a crystal growth of an inorganic semiconductor nanocrystal. After the crystal growth is completed, a seventh oil-soluble organic ligand is added during the cooling process, so that the seventh oil-soluble organic ligand is bound on the surface of the semiconductor nanocrystal to obtain the first composite material. The third oil-soluble organic ligand is a thiol with a carbon number of eight or more. The third temperature is higher than the first temperature and the second temperature.

In this embodiment, the organic alcohol is used as the anionic precursor. The cationic precursor containing a halogen undergoes an alcoholysis reaction with the organic alcohol at high temperature to obtain a metal oxide semiconductor nanocrystal. The halogen ion in the cationic precursor containing the halogen, and the seventh oil-soluble organic ligand are bound on the surface of the metal oxide semiconductor nanocrystal. The first composite material obtained by the reaction of this method has small and uniform size and fewer surface defects. Further, the composite material has no emission peak in the visible band, and does not interfere with the emission of the light-emitting layer in a device structure. The metal oxide semiconductor nanocrystal has the following mixed ligands on the surface thereof: the first halogen ligand and the seventh oil-soluble organic ligand that makes the first composite material oil-soluble. In the first composite material, the first halogen ligand can improve the electron transport performance, and the seventh oil-soluble organic ligand can effectively reduce the electron transport rate, so that the electron transport performance of the material may be adjusted, thereby adjusting the electron transport rate and the hole transport rate in the device, and hence improving the light-emitting efficiency of the light-emitting layer.

In some embodiments, the metal halide includes one or more of chloride, bromide, and iodide of zinc element; or one or more of chloride, bromide, and iodide of cadmium element; or one or more of chloride, bromide, and iodide of tin element; or one or more of chloride, bromide, and iodide of germanium element. For example, the metal halide can include one or more of $ZnCl_2$, $ZnBr_2$ and $ZnI_2$; or one or more of $CdCl_2$, $CdBr_2$ and $CdI_2$; or one or more of $SnCl_2$, $SnBr_2$ and $SnI_2$; or one or more of $GeCl_2$, $GeBr_2$ and $GeI_2$, etc.

Further, in some embodiments, the metal halide includes $ZnCl_2$, $CdCl_2$, $SnCl_2$, $GeCl_2$, etc. Since the atomic radius of chlorine is small compared to bromine and iodine, when it is used as a surface ligand on the surface of the particle, the distance that an electron needs to travel during transport is small, which can improve the electron transportability.

In some embodiments, the organic alcohol includes one or more of octanol, nonanol, decanol, undecanol, dodecanol, tridecanol, tetradecanol, pentadecyl alcohol, hexadecanol, heptadecyl alcohol, and stearyl alcohol, etc.

In some embodiments, the first temperature is 110-190° C.

In some embodiments, the second temperature is 110-190° C.

In this embodiment, the prepared inorganic semiconductor nanocrystal is a metal oxide particle selected from a ZnO particle, a CdO particle, a SnO particle, or a GeO particle, but not limited thereto. With the method of this embodiment to nucleate at a high temperature and by controlling the particle size (e.g., 2-7 nm), the prepared inorganic semiconductor nanocrystal has fewer surface defects and no emission peak in the visible band, and does not interfere with the emission of the light-emitting layer in a device structure. The third temperature is 210-350° C. In some embodiments, the third temperature is 230-300° C.

In some embodiments, dispersing the cationic precursor into the solvent and heating at the first temperature to obtain the first mixture further includes, dispersing a doped metal salt and the cationic precursor into the solvent and heating at the first temperature to obtain the first mixture.

Further, in some embodiments, the doped metal salt includes one or more of a Mg salt, a Mn salt, an Al salt, a Y salt, a V salt and a Ni salt, but is not limited thereto. For example, the Mg salt may include one or more of $MgCl_2$, $MgI_2$, and $Mg(NO_3)_2$, but is not limited thereto; the Mn salt may include one or more of $MnCl_2$, $MnI_2$, and $Mn(NO_3)_2$, but is not limited thereto; the Al salt may include one or more of $AlCl_3$, $AlI_3$, and $Al(CH_3COO)_3$, but is not limited thereto; the Y salt may include one or more of $YCl_2$, $Y(CH_3COO)_2$, and $Y(NO_3)_2$, but is not limited thereto; the V salt may include one or more of $VCl_2$, $V(CH_3COO)_2$, and $V(NO_3)_2$, but is not limited thereto; the Ni salt may include one or more of $NiCl_2$, $Ni(CH_3COO)_2$, and $Ni(NO_3)_2$, but is not limited thereto.

Further, in some embodiments, in the first composite material, the inorganic semiconductor nanocrystal includes a ZnO particle or a SnO particle, and the doped metal element is Al, V, or Y. The HOMO energy levels of these inorganic semiconductor nanocrystals can better match the HOMO energy levels of the quantum dots in the light-emitting layer, and a doped ion can reduce the injection barrier of the electron transport layer to the light-emitting layer, thereby ensuring the effectiveness of the electron transport between the materials of the transport layer and the light-emitting layer. Specifically, the doped metal element is Y.

An embodiment of the present disclosure provides a method for preparing the first composite material including the following processes.

A cationic precursor and a fifth oil-soluble organic ligand are dispersed into a solvent and heated at a first temperature to obtain a first mixture, where the cationic precursor is a metal halide.

An anionic precursor is dispersed into a solvent and heated at a second temperature to obtain a second mixture, where the anionic precursor is a thiol with a carbon number of eight or more and/or a sulfur element.

The first mixture is heated at a third temperature, and the second mixture is injected during the heating process for a crystal growth of a semiconductor nanocrystal to obtain the first composite material, where the third temperature is higher than the first temperature and the second temperature.

In this embodiment, the cationic precursor containing a halogen reacts with the anionic precursor containing a sulfur at high temperature to obtain a metal sulfide semiconductor nanocrystal. The halogen ion in the cationic precursor containing the halogen and the fifth oil-soluble organic ligand are bound on the surface of the metal sulfide semiconductor nanocrystal. With the method of this embodiment to nucleate at a high temperature and by controlling the particle size (e.g., 2-7 nm), the prepared inorganic semiconductor nanocrystal has fewer surface defects and no emission peak in the visible band, and does not interfere with the emission of the light-emitting layer in a device structure. The metal sulfide semiconductor nanocrystal has the following mixed ligands on the surface thereof: the first halogen ligand and the fifth oil-soluble organic ligand that makes the first composite material oil-soluble. In the first composite material, the first halogen ligand can improve the electron transport performance, and the fifth oil-soluble organic ligand can effectively reduce the electron transport rate, so that the electron transport performance of the material may be adjusted, thereby adjusting the electron transport rate and the hole transport rate in the device, and hence improving the light-emitting efficiency of the light-emitting layer.

In some embodiments, the anionic precursor is a thiol with a carbon number of eight or more. The cationic precursor containing a halogen undergoes an alcoholysis reaction with the thiol at high temperature to obtain a metal sulfide semiconductor nanocrystal. The halogen ion in the cationic precursor containing the halogen, and the fifth oil-soluble organic ligand are bound on the surface of the metal sulfide semiconductor nanocrystal. In addition, excess thiol can also be bound on the surface of the metal sulfide semiconductor nanocrystal as surface ligands. When the amount of thiol added is greater than the amount needed for nucleation of the metal sulfide semiconductor nanocrystal growth, it is indicated that the thiol is excessive.

In some embodiments, the anionic precursor is a sulfur element that is added in a form of sulfur-non-coordinating solvent after mixing with a non-coordinating solvent. The sulfur element is dispersed in the non-coordinating solvent to form a uniform liquid, which is convenient for a subsequent injection. The cationic precursor containing a halogen reacts with the sulfur element at high temperature to obtain a metal sulfide semiconductor nanocrystal. The halogen ion in the cationic precursor containing the halogen and the fifth oil-soluble organic ligand are bound on the surface of the metal sulfide semiconductor nanocrystal.

In some embodiments, the sulfur-non-coordinating solvent includes one or more of a sulfur-dodecene, a sulfur-tetradecene, a sulfur-hexadecene, a sulfur-octadecene.

In some embodiments, the anionic precursor is a thiol with a carbon number of eight or more and a sulfur element, where the sulfur element is added in a form of sulfur-non-coordinating solvent after mixing with a non-coordinating solvent. The sulfur element is dispersed in the non-coordinating solvent to form a uniform liquid, which is convenient for a subsequent injection. The cationic precursor containing a halogen reacts with the thiol and the sulfur element at high temperature to obtain a metal sulfide semiconductor nanocrystal. The halogen ion in the cationic precursor containing the halogen and the fifth oil-soluble organic ligand are bound on the surface of the metal sulfide semiconductor nanocrystal. In addition, excess thiol can also be bound on the surface of the metal sulfide semiconductor nanocrystal as surface ligands. When the amount of thiol added is greater than the amount needed for nucleation of the metal sulfide semiconductor nanocrystal growth, it is indicated that the thiol is excessive.

In some embodiments, the sulfur-non-coordinating solvent includes one or more of a sulfur-dodecene, a sulfur-tetradecene, a sulfur-hexadecene, a sulfur-octadecene.

In some embodiments, the thiol with a carbon number of eight or more includes one or more of an octanethiol, a nonanethiol, a decanethiol, an undecanethiol, a dodecanethiol, a tridecanethiol, a tetradecanethiol, a pentadecylthiol, a hexadecanethiol, a heptadecanethiol and an octadecanethiol.

In some embodiments, the metal halide includes one or more of chloride, bromide, and iodide of zinc element; or one or more of chloride, bromide, and iodide of tin element; or one or more of chloride, bromide, and iodide of germanium element. For example, the metal halide can include one or more of $ZnCl_2$, $ZnBr_2$ and $ZnI_2$; or one or more of $SnCl_2$, $SnBr_2$ and $SnI_2$; or one or more of $GeCl_2$, $GeBr_2$ and $GeI_2$, etc.

Further, in some embodiments, the metal halide includes $ZnCl_2$, $SnCl_2$, $GeCl_2$, etc. Since the atomic radius of chlorine is small compared to bromine and iodine, when it is used as a surface ligand on the surface of the particle, the distance that an electron needs to travel during transport is small, which can improve the electron transportability.

In some embodiments, the fifth oil-soluble organic ligand includes one or more of an organic carboxylic acid with a carbon number of eight or more, an organic phosphoric acid with a carbon number of eight or more, a primary amine with a carbon number of eight or more, and a secondary or tertiary amine having a side chain with a carbon number of four or more.

In some embodiments, the first temperature is 110-190° C.

In some embodiments, the second temperature is 110-190° C.

In this embodiment, the prepared inorganic semiconductor nanocrystal is a metal sulfide particle selected from a ZnS particle, a SnS particle, or a GeS particle, but not limited thereto. With the method of this embodiment to nucleate at a high temperature and by controlling the particle size (e.g., 2-7 nm), the prepared inorganic semiconductor nanocrystal has fewer surface defects and no emission peak in the visible band, and does not interfere with the emission of the light-emitting layer in a device structure. The third temperature is 210-350° C. In some embodiments, the third temperature is 230-300° C.

In some embodiments, dispersing the cationic precursor and the fifth oil-soluble organic ligand into the solvent and heating at the first temperature to obtain the first mixture further includes, dispersing a doped metal salt, the cationic precursor and the fifth oil-soluble organic ligand into the solvent and heating at the first temperature to obtain the first mixture.

Further, in some embodiments, the doped metal salt includes one or more of a Mg salt, a Mn salt, an Al salt, a Y salt, a V salt and a Ni salt, but is not limited thereto. For example, the Mg salt may include one or more of $MgCl_2$, $MgI_2$, and $Mg(NO_3)_2$, but is not limited thereto; the Mn salt may include one or more of $MnCl_2$, $MnI_2$, and $Mn(NO_3)_2$, but is not limited thereto; the Al salt may include one or more of $AlCl_3$, $AlI_3$, and $Al(CH_3COO)_3$, but is not limited thereto; the Y salt may include one or more of $YCl_2$, $Y(CH_3COO)_2$, and $Y(NO_3)_2$, but is not limited thereto; the V salt may include one or more of $VCl_2$, $V(CH_3COO)_2$, and $V(NO_3)_2$, but is not limited thereto; the Ni salt may include one or more of $NiCl_2$, $Ni(CH_3COO)_2$, and $Ni(NO_3)_2$, but is not limited thereto.

Further, in some embodiments, in the first composite material, the inorganic semiconductor nanocrystal includes a ZnS particle, and the doped metal element is Al, V, or Y. The HOMO energy levels of this inorganic semiconductor nanocrystal can better match the HOMO energy levels of the quantum dots in the light-emitting layer, and a doped ion can reduce the injection barrier of the electron transport layer to the light-emitting layer, thereby ensuring the effectiveness of the electron transport between the materials of the transport layer and the light-emitting layer. Specifically, the doped metal element is Y.

An embodiment of the present disclosure provides a method for preparing the first composite material including the following processes.

A cationic precursor is dispersed into a solvent and heated at a first temperature to obtain a first mixture, where the cationic precursor is a metal halide.

An anionic precursor and a sixth oil-soluble organic ligand are dispersed into a solvent and heated at a second temperature to obtain a second mixture, where the anionic precursor is a thiol with a carbon number of eight or more and/or a sulfur element.

The first mixture is heated at a third temperature, and the second mixture is injected during the heating process for a crystal growth of an inorganic semiconductor nanocrystal to obtain the first composite material, where the third temperature is higher than the first temperature and the second temperature.

In this embodiment, the cationic precursor containing a halogen reacts with the anionic precursor containing a sulfur at high temperature to obtain a metal sulfide semiconductor nanocrystal. The halogen ion in the cationic precursor containing the halogen and the sixth oil-soluble organic ligand are bound on the surface of the metal sulfide semiconductor nanocrystal. With the method of this embodiment to nucleate at a high temperature and by controlling the particle size (e.g., 2-7 nm), the prepared inorganic semiconductor nanocrystal has fewer surface defects and no emission peak in the visible band, and does not interfere with the emission of the light-emitting layer in a device structure. The metal sulfide semiconductor nanocrystal has the following mixed ligands on the surface thereof: the first halogen ligand and the sixth oil-soluble organic ligand that makes the first composite material oil-soluble. In the first composite material, the first halogen ligand can improve the electron transport performance, and the sixth oil-soluble organic ligand can effectively reduce the electron transport rate, so that the electron transport performance of the material may be adjusted, thereby adjusting the electron transport rate and the hole transport rate in the device, and hence improving the light-emitting efficiency of the light-emitting layer.

In some embodiments, the anionic precursor is a thiol with a carbon number of eight or more. The cationic precursor containing a halogen undergoes an alcoholysis reaction with the thiol at high temperature to obtain a metal sulfide semiconductor nanocrystal. The halogen ion in the cationic precursor containing the halogen and the sixth oil-soluble organic ligand are bound on the surface of the metal sulfide semiconductor nanocrystal. In addition, excess thiol can also be bound on the surface of the metal sulfide semiconductor nanocrystal as surface ligands. When the amount of thiol added is greater than the amount needed for nucleation of the metal sulfide semiconductor nanocrystal growth, it is indicated that the thiol is excessive.

In some embodiments, the anionic precursor is a sulfur element. After the sulfur element is mixed with the sixth oil-soluble organic ligand, the formed sulfur ion reacts with a metal ion in the cationic precursor at a high temperature to nucleate to obtain a sulfide semiconductor nanocrystal. The halogen ion in the cationic precursor containing the halogen, and the sixth oil-soluble organic ligand are bound on the surface of the metal sulfide semiconductor nanocrystal.

In some embodiments, the anionic precursor is a thiol with a carbon number of eight or more and a sulfur element, where after the sulfur element is mixed with the sixth oil-soluble organic ligand, the formed sulfur ion reacts with a metal ion in the cationic precursor at a high temperature to nucleate to obtain a sulfide semiconductor nanocrystal. The halogen ion in the cationic precursor containing the halogen, and the sixth oil-soluble organic ligand are bound on the surface of the metal sulfide semiconductor nanocrystal. In addition, excess thiol can also be bound on the surface of the metal sulfide semiconductor nanocrystal as surface ligands. When the amount of thiol added is greater than the amount needed for nucleation of the metal sulfide semiconductor nanocrystal growth, it is indicated that the thiol is excessive.

In some embodiments, the thiol with a carbon number of eight or more includes one or more of an octanethiol, a nonanethiol, a decanethiol, an undecanethiol, a dodecanethiol, a tridecanethiol, a tetradecanethiol, a pentadecylthiol, a hexadecanethiol, a heptadecanethiol and an octadecanethiol.

In some embodiments, the metal halide includes one or more of chloride, bromide, and iodide of zinc element; or one or more of chloride, bromide, and iodide of tin element; or one or more of chloride, bromide, and iodide of germanium element. For example, the metal halide can include one or more of $ZnCl_2$, $ZnBr_2$ and $ZnI_2$; or one or more of $SnCl_2$, $SnBr_2$ and $SnI_2$; or one or more of $GeCl_2$, $GeBr_2$ and $GeI_2$, etc.

Further, in some embodiments, the metal halide includes $ZnCl_2$, $SnCl_2$, $GeCl_2$, etc. Since the atomic radius of chlorine is small compared to bromine and iodine, when it is used as a surface ligand on the surface of the particle, the distance that an electron needs to travel during transport is small, which can improve the electron transportability.

In some embodiments, the sixth oil-soluble organic ligand includes one or more of a substituted or unsubstituted alkylaminophosphine, a substituted or unsubstituted alkoxyphosphine, a substituted or unsubstituted silylphosphine, and an alkylphosphine having a side chain with a carbon number of four or more.

Further, in some embodiments, the sixth oil-soluble organic ligand is a substituted or unsubstituted alkylaminophosphine that is bonded to cations on the surface of the inorganic semiconductor nanocrystal by a lone electron pair of P and a hydrogen bond in —$NH_2$ simultaneously. Since an ionic bond of the halogen ligand is strong, the bond between the alkylaminophosphine and the surface of the particle is strong and the oil-soluble organic ligand is not easy to fall off. In addition, when the alkylaminophosphine and the iodine ligand are bonded to the metal sulfide particle, no —OH is bonded to the surface of the metal sulfide particle, which will not cause hydrolysis or oxidation of the metal sulfide particle.

In some embodiments, the first temperature is 110-190° C.

In some embodiments, the second temperature is 110-190° C.

In this embodiment, the prepared inorganic semiconductor nanocrystal is a metal sulfide particle selected from a ZnS particle, a SnS particle, or a GeS particle, but not limited thereto. With the method of this embodiment to nucleate at a high temperature and by controlling the particle size (e.g., 2-7 nm), the prepared inorganic semiconductor nanocrystal has fewer surface defects and no emission peak in the visible band, and does not interfere with the emission of the light-emitting layer in a device structure. The third temperature is 210-350° C. In some embodiments, the third temperature is 230-300° C.

In some embodiments, dispersing the cationic precursor into the solvent and heating at the first temperature to obtain the first mixture further includes, dispersing a doped metal salt and the cationic precursor into the solvent and heating at the first temperature to obtain the first mixture.

Further, in some embodiments, the doped metal salt includes one or more of a Mg salt, a Mn salt, an Al salt, a Y salt, a V salt and a Ni salt, but is not limited thereto. For example, the Mg salt may include one or more of $MgCl_2$, $MgI_2$, and $Mg(NO_3)_2$, but is not limited thereto; the Mn salt may include one or more of $MnCl_2$, $MnI_2$, and $Mn(NO_3)_2$, but is not limited thereto; the Al salt may include one or more of $AlCl_3$, $AlI_3$, and $Al(CH_3COO)_3$, but is not limited thereto; the Y salt may include one or more of $YCl_2$, $Y(CH_3COO)_2$, and $Y(NO_3)_2$, but is not limited thereto; the V salt may include one or more of $VCl_2$, $V(CH_3COO)_2$, and $V(NO_3)_2$, but is not limited thereto; the Ni salt may include one or more of $NiCl_2$, $Ni(CH_3COO)_2$, and $Ni(NO_3)_2$, but is not limited thereto.

Further, in some embodiments, in the first composite material, the inorganic semiconductor nanocrystal includes a ZnS particle, and the doped metal element is Al, V, or Y. The HOMO energy levels of this inorganic semiconductor nanocrystal can better match the HOMO energy levels of the quantum dots in the light-emitting layer, and a doped ion can reduce the injection barrier of the electron transport layer to the light-emitting layer, thereby ensuring the effectiveness of the electron transport between the materials of the transport layer and the light-emitting layer. Specifically, the doped metal element is Y.

An embodiment of the present disclosure provides a method for preparing the first composite material including the following processes.

A cationic precursor and a fifth oil-soluble organic ligand are dispersed into a solvent and heated at a first temperature to obtain a first mixture, where the cationic precursor is a metal halide.

An anionic precursor and a sixth oil-soluble organic ligand are dispersed into a solvent and heated at a second temperature to obtain a second mixture, where the anionic precursor is a thiol with a carbon number of eight or more and/or a sulfur element.

The first mixture is heated at a third temperature, and the second mixture is injected during the heating process for a crystal growth of a semiconductor nanocrystal to obtain the first composite material, where the third temperature is higher than the first temperature and the second temperature.

In this embodiment, the cationic precursor containing a halogen reacts with the anionic precursor containing a sulfur at high temperature to obtain a metal sulfide semiconductor nanocrystal. The halogen ion in the cationic precursor containing the halogen, the fifth oil-soluble organic ligand, and the sixth oil-soluble organic ligand are bound on the surface of the metal sulfide semiconductor nanocrystal. With the method of this embodiment to nucleate at a high temperature and by controlling the particle size (e.g., 2-7 nm), the prepared inorganic semiconductor nanocrystal has fewer surface defects and no emission peak in the visible band, and does not interfere with the emission of the light-emitting layer in a device structure. The metal sulfide semiconductor nanocrystal has the following mixed ligands on the surface thereof: the first halogen ligand, the fifth oil-soluble organic ligand, and the sixth oil-soluble organic ligand that make the first composite material oil-soluble. In the first composite material, the first halogen ligand can improve the electron transport performance, and the fifth oil-soluble organic ligand and the sixth oil-soluble organic ligand can effectively reduce the electron transport rate, so that the electron transport performance of the material may be adjusted, thereby adjusting the electron transport rate and the hole transport rate in the device, and hence improving the light-emitting efficiency of the light-emitting layer.

In some embodiments, the anionic precursor is a thiol with a carbon number of eight or more. The cationic precursor containing a halogen undergoes an alcoholysis reaction with the thiol at high temperature to obtain a metal sulfide semiconductor nanocrystal. The halogen ion in the cationic precursor containing the halogen, the fifth oil-soluble organic ligand and the sixth oil-soluble organic ligand are bound on the surface of the metal sulfide semiconductor nanocrystal. In addition, excess thiol can also be bound on the surface of the metal sulfide semiconductor nanocrystal as surface ligands. When the amount of thiol added is greater than the amount needed for nucleation of the metal sulfide semiconductor nanocrystal growth, it is indicated that the thiol is excessive.

In some embodiments, the anionic precursor is a sulfur element. After the sulfur element is mixed with the sixth oil-soluble organic ligand, the formed sulfur ion reacts with a metal ion in the cationic precursor at a high temperature to nucleate to obtain a sulfide semiconductor nanocrystal. The halogen ion in the cationic precursor containing the halogen, the fifth oil-soluble organic ligand and the sixth oil-soluble organic ligand are bound on the surface of the metal sulfide semiconductor nanocrystal.

In some embodiments, the anionic precursor is a thiol with a carbon number of eight or more and a sulfur element, where after the sulfur element is mixed with the sixth oil-soluble organic ligand, the formed sulfur ion reacts with a metal ion in the cationic precursor at a high temperature to nucleate to obtain a sulfide semiconductor nanocrystal. The halogen ion in the cationic precursor containing the halogen, the fifth oil-soluble organic ligand and the sixth oil-soluble organic ligand are bound on the surface of the metal sulfide semiconductor nanocrystal. In addition, excess thiol can also be bound on the surface of the metal sulfide semiconductor nanocrystal as surface ligands. When the amount of thiol added is greater than the amount needed for nucleation of the metal sulfide semiconductor nanocrystal growth, it is indicated that the thiol is excessive.

In some embodiments, the thiol with a carbon number of eight or more includes one or more of an octanethiol, a nonanethiol, a decanethiol, an undecanethiol, a dodecanethiol, a tridecanethiol, a tetradecanethiol, a pentadecylthiol, a hexadecanethiol, a heptadecanethiol and an octadecanethiol.

In some embodiments, the fifth oil-soluble organic ligand includes one or more of an organic carboxylic acid with a carbon number of eight or more, an organic phosphoric acid with a carbon number of eight or more, a primary amine with a carbon number of eight or more, and a secondary or tertiary amine having a side chain with a carbon number of four or more; and/or the sixth oil-soluble organic ligand includes one or more of a substituted or unsubstituted alkylaminophosphine, a substituted or unsubstituted alkoxyphosphine, a substituted or unsubstituted silylphosphine, and an alkylphosphine having a side chain with a carbon number of four or more.

Further, in some embodiments, the fifth oil-soluble organic ligand is an organic phosphoric acid with a carbon number of eight or more, and the sixth oil-soluble organic ligand is a substituted or unsubstituted alkylaminophosphine. The organic phosphoric acid is bonded to cations on the surface of the inorganic semiconductor nanocrystal by an ionic bond. The alkylaminophosphine is bonded to cations on the surface of the inorganic semiconductor nanocrystal by a lone electron pair of P and a hydrogen bond in —$NH_2$ simultaneously. These two bonds are strong and hence the oil-soluble organic ligand is not easy to fall off, thereby ensuring the solubility and transportability of the composite material. Further, these two types of ligands are not bonded to surface ions of the inorganic semiconductor nanocrystal through a —OH, and hence will not undergo hydrolysis.

Further, in some embodiments, the anionic precursor is a thiol with a carbon number of eight or more, or a thiol and a sulfur element, where the amount of thiol added is greater than the amount needed for nucleation of the semiconductor nanocrystal. The fifth oil-soluble organic ligand is an organic phosphoric acid with a carbon number of eight or more, and the sixth oil-soluble organic ligand is a substituted or unsubstituted alkylaminophosphine. When the amount of thiol added is greater than the amount needed for nucleation of the metal sulfide semiconductor nanocrystal growth, it is indicated that the thiol is excessive. The excess thiol can also be bound on the surface of the metal sulfide semiconductor nanocrystal as surface ligands. The organic phosphoric acid is bonded to cations on the surface of the inorganic semiconductor nanocrystal by an ionic bond. The thiol is bonded to cations on the surface of the inorganic semiconductor nanocrystal by a hydrogen bond. The alkylaminophosphine is bonded to cations on the surface of the inorganic semiconductor nanocrystal by a lone electron pair of P and a hydrogen bond in —$NH_2$ simultaneously. These bonds are strong and hence the oil-soluble organic ligand is not easy to fall off, thereby ensuring the solubility and transportability of the first composite material. Further, these types of ligands are not bonded to surface ions of the inorganic semiconductor nanocrystal through a —OH, and hence will not undergo hydrolysis.

In some embodiments, the first temperature is 110-190° C.

In some embodiments, the second temperature is 110-190° C.

In this embodiment, the prepared inorganic semiconductor nanocrystal is a metal sulfide particle selected from a ZnS particle, a SnS particle, or a GeS particle, but not limited thereto. At a small particle size (2-7 nm), the inorganic semiconductor nanocrystal mainly emits light through defect states. With the method of this embodiment to nucleate at a high temperature and by controlling the particle size (e.g., 2-7 nm), the prepared inorganic semiconductor nanocrystal has fewer surface defects and no emission peak in the visible band, and does not interfere with the emission of the light-emitting layer in a device structure. The third temperature is 210-350° C. In some embodiments, the third temperature is 230-300° C.

In some embodiments, dispersing the cationic precursor and the fifth oil-soluble organic ligand into the solvent and heating at the first temperature to obtain the first mixture further includes, dispersing a doped metal salt, the cationic precursor and the fifth oil-soluble organic ligand into the solvent and heating at the first temperature to obtain the first mixture.

Further, in some embodiments, the doped metal salt includes one or more of a Mg salt, a Mn salt, an Al salt, a Y salt, a V salt and a Ni salt, but is not limited thereto. For example, the Mg salt may include one or more of $MgCl_2$, $MgI_2$, and $Mg(NO_3)_2$, but is not limited thereto; the Mn salt may include one or more of $MnCl_2$, $MnI_2$, and $Mn(NO_3)_2$, but is not limited thereto; the Al salt may include one or more of $AlCl_3$, $AlI_3$, and $Al(CH_3COO)_3$, but is not limited thereto; the Y salt may include one or more of $YCl_2$, $Y(CH_3COO)_2$, and $Y(NO_3)_2$, but is not limited thereto; the V salt may include one or more of $VCl_2$, $V(CH_3COO)_2$, and $V(NO_3)_2$, but is not limited thereto; the Ni salt may include one or more of $NiCl_2$, $Ni(CH_3COO)_2$, and $Ni(NO_3)_2$, but is not limited thereto.

Further, in some embodiments, in the first composite material, the inorganic semiconductor nanocrystal includes a ZnS particle, and the doped metal element is Al, V, or Y. The HOMO energy levels of this inorganic semiconductor nanocrystal can better match the HOMO energy levels of the quantum dots in the light-emitting layer, and a doped ion can reduce the injection barrier of the electron transport layer to the light-emitting layer, thereby ensuring the effectiveness of the electron transport between the materials of the transport layer and the light-emitting layer. Specifically, the doped metal element is Y.

An embodiment of the present disclosure provides a method for preparing the first composite material including the following processes.

A cationic precursor is dispersed into a solvent and heated at a first temperature to obtain a first mixture, where the cationic precursor is a metal halide.

An anionic precursor is dispersed into a solvent and heated at a second temperature to obtain a second mixture, where the anionic precursor is a thiol with a carbon number of eight or more and/or a sulfur element.

The first mixture is heated at a third temperature, and the second mixture is injected during the heating process for a crystal growth of a semiconductor nanocrystal. After the crystal growth is completed, a seventh oil-soluble organic ligand is added during the cooling process, so that the seventh oil-soluble organic ligand is bound on the surface of the semiconductor nanocrystal to obtain the first composite material. The third oil-soluble organic ligand is a thiol with a carbon number of eight or more. The third temperature is higher than the first temperature and the second temperature.

In this embodiment, the cationic precursor containing a halogen reacts with the anionic precursor containing a sulfur at high temperature to obtain a metal sulfide semiconductor nanocrystal. The halogen ion in the cationic precursor containing the halogen and the seventh oil-soluble organic ligand are bound on the surface of the metal sulfide semiconductor nanocrystal. With the method of this embodiment to nucleate at a high temperature and by controlling the particle size (e.g., 2-7 nm), the prepared inorganic semiconductor nanocrystal has fewer surface defects and no emission peak in the visible band, and does not interfere with the emission of the light-emitting layer in a device structure. The metal sulfide semiconductor nanocrystal has the following mixed ligands on the surface thereof: the first halogen ligand and the seventh oil-soluble organic ligand that makes the first composite material oil-soluble. In the first composite material, the first halogen ligand can improve the electron transport performance, and the seventh oil-soluble organic ligand can effectively reduce the electron transport rate, so that the electron transport performance of the material may be adjusted, thereby adjusting the electron transport rate and the hole transport rate in the device, and hence improving the light-emitting efficiency of the light-emitting layer.

In some embodiments, the anionic precursor is a thiol with a carbon number of eight or more. The cationic precursor containing a halogen undergoes an alcoholysis reaction with the thiol at high temperature to obtain a metal sulfide semiconductor nanocrystal. The halogen ion in the cationic precursor containing the halogen and the seventh oil-soluble organic ligand are bound on the surface of the metal sulfide semiconductor nanocrystal. In addition, excess thiol can also be bound on the surface of the metal sulfide semiconductor nanocrystal as surface ligands. When the amount of thiol added is greater than the amount needed for nucleation of the metal sulfide semiconductor nanocrystal growth, it is indicated that the thiol is excessive.

In some embodiments, the anionic precursor is a sulfur element that is added in a form of sulfur-non-coordinating solvent after mixing with a non-coordinating solvent. The sulfur element is dispersed in the non-coordinating solvent to form a uniform liquid, which is convenient for a subsequent injection. The cationic precursor containing a halogen reacts with the sulfur element at high temperature to obtain a metal sulfide semiconductor nanocrystal. The halogen ion in the cationic precursor containing the halogen and the seventh oil-soluble organic ligand are bound on the surface of the metal sulfide semiconductor nanocrystal.

In some embodiments, the sulfur-non-coordinating solvent includes one or more of a sulfur-dodecene, a sulfur-tetradecene, a sulfur-hexadecene, a sulfur-octadecene.

In some embodiments, the anionic precursor is a thiol with a carbon number of eight or more and a sulfur element, where the sulfur element is added in a form of sulfur-non-coordinating solvent after mixing with a non-coordinating solvent. The sulfur element is dispersed in the non-coordinating solvent to form a uniform liquid, which is convenient for a subsequent injection. The cationic precursor containing a halogen reacts with the thiol and the sulfur element at high temperature to obtain a metal sulfide semiconductor nanocrystal. The halogen ion in the cationic precursor containing the halogen and the seventh oil-soluble organic ligand are bound on the surface of the metal sulfide semiconductor nanocrystal. In addition, excess thiol can also be bound on the surface of the metal sulfide semiconductor nanocrystal as surface ligands. When the amount of thiol added is greater than the amount needed for nucleation of the metal sulfide semiconductor nanocrystal growth, it is indicated that the thiol is excessive.

In some embodiments, the sulfur-non-coordinating solvent includes one or more of a sulfur-dodecene, a sulfur-tetradecene, a sulfur-hexadecene, a sulfur-octadecene.

In some embodiments, the thiol with a carbon number of eight or more includes one or more of an octanethiol, a nonanethiol, a decanethiol, an undecanethiol, a dodecanethiol, a tridecanethiol, a tetradecanethiol, a pentadecylthiol, a hexadecanethiol, a heptadecanethiol and an octadecanethiol.

In some embodiments, the metal halide includes one or more of chloride, bromide, and iodide of zinc element; or one or more of chloride, bromide, and iodide of tin element; or one or more of chloride, bromide, and iodide of germanium element. For example, the metal halide can include one or more of $ZnCl_2$, $ZnBr_2$ and $ZnI_2$; or one or more of $SnCl_2$, $SnBr_2$ and $SnI_2$; or one or more of $GeCl_2$, $GeBr_2$ and $GeI_2$, etc.

Further, in some embodiments, the metal halide includes $ZnCl_2$, $SnCl_2$, $GeCl_2$, etc. Since the atomic radius of chlorine is small compared to bromine and iodine, when it is used as a surface ligand on the surface of the particle, the distance that an electron needs to travel during transport is small, which can improve the electron transportability.

In some embodiments, the first temperature is 110-190° C.

In some embodiments, the second temperature is 110-190° C.

In this embodiment, the prepared inorganic semiconductor nanocrystal is a metal sulfide particle selected from a ZnS particle, a SnS particle, or a GeS particle, but not limited thereto. With the method of this embodiment to nucleate at a high temperature and by controlling the particle size (e.g., 2-7 nm), the prepared inorganic semiconductor nanocrystal has fewer surface defects and no emission peak in the visible band, and does not interfere with the emission of the light-emitting layer in a device structure. The third temperature is 210-350° C. In some embodiments, the third temperature is 230-300° C.

In some embodiments, dispersing the cationic precursor into the solvent and heating at the first temperature to obtain the first mixture further includes, dispersing a doped metal salt and the cationic precursor into the solvent and heating at the first temperature to obtain the first mixture.

Further, in some embodiments, the doped metal salt includes one or more of a Mg salt, a Mn salt, an Al salt, a Y salt, a V salt and a Ni salt, but is not limited thereto. For example, the Mg salt may include one or more of $MgCl_2$, $MgI_2$, and $Mg(NO_3)_2$, but is not limited thereto; the Mn salt may include one or more of $MnCl_2$, $MnI_2$, and $Mn(NO_3)_2$, but is not limited thereto; the Al salt may include one or more of $AlCl_3$, $AlI_3$, and $Al(CH_3COO)_3$, but is not limited thereto; the Y salt may include one or more of $YCl_2$, $Y(CH_3COO)_2$, and $Y(NO_3)_2$, but is not limited thereto; the V salt may include one or more of $VCl_2$, $V(CH_3COO)_2$, and $V(NO_3)_2$, but is not limited thereto; the Ni salt may include one or more of $NiCl_2$, $Ni(CH_3COO)_2$, and $Ni(NO_3)_2$, but is not limited thereto.

Further, in some embodiments, in the first composite material, the inorganic semiconductor nanocrystal includes a ZnS particle, and the doped metal element is Al, V, or Y. The HOMO energy levels of this inorganic semiconductor nanocrystal can better match the HOMO energy levels of the quantum dots in the light-emitting layer, and a doped ion can reduce the injection barrier of the electron transport layer to the light-emitting layer, thereby ensuring the effectiveness of the electron transport between the materials of the transport layer and the light-emitting layer. Specifically, the doped metal element is Y.

The disclosure will be described in detail below with reference to some specific embodiments.

In one embodiment, the preparation process of a composite material (CdZnS/ZnS quantum dots with surface ligands of octadecylphosphoric acid, trioctylphosphine, and $Cl^-$) is as follows.

4 mmol zinc acetate and 1 mmol cadmium chloride are mixed with 10 mmol octadecyl phosphoric acid and 30 mL octadecene (ODE), and heated to 150° C. and maintained for 60 minutes under an Ar atmosphere, to obtain a cationic precursor solution.

1 mmol S is mixed with 3 mL ODE, and heated to 140° C. and maintained for 30 minutes under an Ar atmosphere, to obtain an anionic precursor solution 1; 3 mmol S is mixed with 6 mL trioctylphosphine, and heated to 140° C. and maintained for 30 minutes under an Ar atmosphere, to obtain an anionic precursor solution 2.

The cationic precursor solution is heated to 230° C., the anionic precursor solution 1 is injected, the temperature is maintained for 5 minutes, and then the anionic precursor solution 2 is added to the reaction solution to react for 30 minutes, to obtain CdZnS/ZnS quantum dots with surface ligands of octadecylphosphoric acid, trioctylphosphine, and $Cl^-$, that is, the composite material of this embodiment.

In another embodiment, the preparation process of a composite material (CdZnSe/CdZnS/ZnS quantum dots with surface ligands of octadecenoic acid, trioctylphosphine, and $Br^-$) is as follows.

8 mmol zinc bromide and 0.8 mmol cadmium bromide are mixed with 10 mmol octadecenoic acid and 30 mL octadecene (ODE), and heated to 150° C. and maintained for 60 minutes under an Ar atmosphere, to obtain a cationic precursor solution.

1 mmol Se is mixed with 3 mL ODE, and heated to 250° C. and maintained for 30 minutes under an Ar atmosphere, to obtain an anionic precursor solution 1; 4 mmol S is mixed with 8 mL trioctylphosphine, and heated to 140° C. and maintained for 30 minutes under an Ar atmosphere, to obtain an anionic precursor solution 2.

The cationic precursor solution is heated to 260° C., the anionic precursor solution 1 is injected, the temperature is maintained for 10 minutes, 6 mL anionic precursor solution 2 is added to the reaction solution to react for 30 minutes, and then 2 mL anionic precursor solution 2 is added to the reaction solution to react for 10 minutes, to obtain CdZnSe/CdZnS/ZnS quantum dots with surface ligands of octadecenoic acid, trioctylphosphine, and $Br^-$, that is, the composite material of this embodiment.

In another embodiment, the preparation process of a composite material (CdZnSe/ZnSe quantum dots with surface ligands of octadecenoic acid, tris (dimethylamino) phosphine, and $Cl^-$) is as follows.

8 mmol zinc chloride and 0.8 mmol cadmium chloride are mixed with 10 mmol octadecenoic acid and 30 mL octadecene (ODE), and heated to 150° C. and maintained for 60 minutes under an Ar atmosphere, to obtain a cationic precursor solution.

1 mmol Se is mixed with 3 mL ODE, and heated to 250° C. and maintained for 30 minutes under an Ar atmosphere, to obtain an anionic precursor solution 1; 4 mmol Se is mixed with 8 mL tris (dimethylamino) phosphine, and heated to 140° C. and maintained for 30 minutes under an Ar atmosphere, to obtain an anionic precursor solution 2.

The cationic precursor solution is heated to 280° C., the anionic precursor solution 1 is injected, the temperature is maintained for 10 minutes, and then the anionic precursor solution 2 is added to the reaction solution to react for 30 minutes, to obtain CdZnSe/ZnSe quantum dots with surface ligands of octadecenoic acid, tris (dimethylamino) phosphine, and $Cl^-$, that is, the composite material of this embodiment.

In another embodiment, the preparation process of a composite material (InP/ZnS quantum dots with surface ligands of octadecenoic acid, chloro (diisopropylamino) methoxyphosphine, trioctylphosphine, and $Cl^-$) is as follows.

0.8 mmol indium chloride is mixed with 10 mmol octadecenoic acid and 30 mL octadecene (ODE), and heated to 150° C. and maintained for 60 minutes under an Ar atmosphere, to obtain a cationic precursor solution 1; 4 mmol zinc chloride is mixed with 10 mmol octadecenoic acid and 10 mL octadecene (ODE), and heated to 250° C. and maintained for 60 minutes under an Ar atmosphere, to obtain a cationic precursor solution 2.

0.8 mmol chloro (diisopropylamino) methoxyphosphine is mixed with 3 mL ODE, to obtain an anionic precursor solution 1; 4 mmol S is mixed with trioctylphosphine, and heated to 140° C. and maintained for 30 minutes under an Ar atmosphere, to obtain an anionic precursor solution 2.

The cationic precursor solution 1 is heated to 300° C., the anionic precursor solution 1 is injected, the temperature is maintained for 10 minutes, and then the cationic precursor solution 2 and the anionic precursor solution 2 are added to the reaction solution simultaneously to react for 30 minutes, to obtain InP/ZnS quantum dot with surface ligands of octadecenoic acid, chloro (diisopropylamino) methoxyphosphine, trioctylphosphine, and a $Cl^-$, that is, the composite material of this embodiment.

In one embodiment, the structure of a quantum dot light-emitting diode includes a glass substrate, an ITO anode, a hole injection layer, a 35 nm hole transport layer, a 20 nm quantum dot light-emitting layer, a 40 nm electron transport layer, and a 100 nm cathode layered from bottom to top. The quantum dot light-emitting layer is a CdZnS/ZnS quantum dot layer with surface ligands of octadecylphosphoric acid and Cl⁻. The preparation method of the quantum dot light-emitting diode device is as follows.

A hole injection layer and a 35 nm hole transport layer are sequentially coated over an ITO bottom electrode.

A heptane solution of CdZnS/ZnS quantum dot with surface ligands of octadecylphosphoric acid and Cl⁻ is spin coated with a rotation speed of 2000 rpm over the hole transport layer to form a 20 nm quantum dot light-emitting layer.

A methanol solution of ZnO is spin coated over the quantum dot light-emitting layer, to form a 40 nm layer.

A 100 nm Ag electrode is formed over the electron transport layer using a vapor deposition method.

The manufactured quantum dot light-emitting diode is encapsulated with ultraviolet curing adhesive to obtain a quantum dot light-emitting diode device.

In another embodiment, the structure of a quantum dot light-emitting diode includes a glass substrate, an ITO anode, a hole injection layer, a 35 nm hole transport layer, a 40 nm quantum dot light-emitting layer, a 50 nm electron transport layer, and a 100 nm cathode layered from bottom to top. The quantum dot light-emitting layer includes a CdZnSe/ZnSe quantum dot layer with surface ligands of octadecyl phosphoric acid and 3-mercaptopropionic acid, and a polar CdZnSe/ZnSe quantum dot light-emitting layer, where the thickness of each layer is 20 nm. The preparation method of the quantum dot light-emitting diode device is as follows.

A hole injection layer and a 35 nm hole transport layer are sequentially coated over an ITO bottom electrode.

A 20 mg/ml heptane solution of light-emitting quantum dot is spin coated with a rotation speed of 2000 rpm over the hole transport layer to form a CdZnSe/ZnSe quantum dot light-emitting layer with surface ligands of octadecyl phosphoric acid and 3-mercaptopropionic acid; and then a 20 mg/ml ethanol solution of CdZnSe/ZnSe is coated to form a 20 nm polar CdZnSe/ZnSe quantum dot light-emitting layer.

A methoanol solution of ZnO is spin coated over the quantum dot light-emitting layer, where the thickness is 50 nm.

A 100 nm Ag electrode is formed over the electron transport layer using a vapor deposition method.

The manufactured quantum dot light-emitting diode is encapsulated with ultraviolet curing adhesive to obtain a quantum dot light-emitting diode device.

In another embodiment, the structure of a quantum dot light-emitting diode includes a glass substrate, an ITO anode, a hole injection layer, a 20 nm hole transport layer, a 30 nm quantum dot light-emitting layer, a 60 nm electron transport layer, and an 80 nm cathode layered from bottom to top. The light-emitting layer includes a CdZnSe/ZnSe quantum dot layer with surface ligands of octanethiol and Br⁻, a polar CdZnSe/ZnSe quantum dot light-emitting layer, and a CdZnSe/ZnSe quantum dot layer with surface ligands of octanethiol and Br⁻, where the thickness of each layer is 10 nm. The preparation method of the quantum dot light-emitting diode device is as follows.

A hole injection layer and a 20 nm hole transport layer are sequentially coated over an ITO bottom electrode.

A 20 mg/ml heptane solution of CdZnSe/ZnSe with mixed ligands of octanethiol and Br⁻ is spin coated with a rotation speed of 2000 rpm over the hole transport layer to form a CdZnSe/ZnSe quantum dot layer with surface ligands of octanethiol and Br⁻; a 20 mg/ml ethanol solution of CdZnSe/ZnSe is coated to form a 10 nm polar CdZnSe/ZnSe quantum dot light-emitting layer; and then a 20 mg/ml heptane solution of CdZnSe/ZnSe with mixed ligands of octanethiol and Br⁻ is coated to form a CdZnSe/ZnSe quantum dot layer with surface ligands of octanethiol and Br⁻.

A methoanol solution of ZnO is spin coated over the quantum dot light-emitting layer, where the thickness is 60 nm.

An 80 nm Al electrode is formed over the electron transport layer using a vapor deposition method.

The manufactured quantum dot light-emitting diode is encapsulated with ultraviolet curing adhesive to obtain a quantum dot light-emitting diode device.

In another embodiment, the structure of a quantum dot light-emitting diode includes a glass substrate, an ITO anode, a hole injection layer, a 20 nm hole transport layer, a 60 nm quantum dot light-emitting layer, a 60 nm electron transport layer, and an 80 nm cathode layered from bottom to top. The light-emitting layer includes a CdZnSe/ZnS quantum dot layer with surface ligands of tris (dimethylamino) phosphine and 6-mercapto-1-hexanol, a polar CdZnSe/ZnS quantum dot light-emitting layer, a CdZnSe/ZnS quantum dot layer with surface ligands of tris (dimethylamino) phosphine and 6-mercapto-1-hexanol, a polar CdZnSe/ZnS quantum dot light-emitting layer, a CdZnSe/ZnS quantum dot layer with surface ligands of tris (dimethylamino) phosphine and 6-mercapto-1-hexanol, and a polar CdZnSe/ZnS quantum dot light-emitting layer, where the thickness of each layer is 10 nm. The preparation method of the quantum dot light-emitting diode device is as follows.

A hole injection layer and a 20 nm hole transport layer are sequentially coated over an ITO bottom electrode.

A 20 mg/ml heptane solution of CdZnSe/ZnS with mixed ligands of tris (dimethylamino) phosphine and 6-mercapto-1-hexanol, and an ethanol solution of CdZnSe/ZnS are sequentially spin coated with a rotation speed of 2000 rpm over the hole transport layer to form a CdZnSe/ZnS quantum dot layer with surface ligands of tris (dimethylamino) phosphine and 6-mercapto-1-hexanol, a polar CdZnSe/ZnS quantum dot light-emitting layer, a CdZnSe/ZnS quantum dot layer with surface ligands of tris (dimethylamino) phosphine and 6-mercapto-1-hexanol, a polar CdZnSe/ZnS quantum dot light-emitting layer, a CdZnSe/ZnS quantum dot layer with surface ligands of tris (dimethylamino) phosphine and 6-mercapto-1-hexanol, and a polar CdZnSe/ZnS quantum dot light-emitting layer, where the thickness of each layer is 10 nm.

A methoanol solution of ZnO is spin coated over the quantum dot light-emitting layer, where the thickness is 60 nm.

An 80 nm Al electrode is formed over the electron transport layer using a vapor deposition method.

The manufactured quantum dot light-emitting diode is encapsulated with ultraviolet curing adhesive to obtain a quantum dot light-emitting diode device.

In another embodiment, the structure of a quantum dot light-emitting diode includes a glass substrate, an ITO anode, a hole injection layer, a 35 nm hole transport layer, a 20 nm quantum dot light-emitting layer, a 50 nm electron transport layer, and a 100 nm cathode layered from bottom to top. The light-emitting layer and the electron transport layer both include quantum dots with mixed ligands. The preparation method of the quantum dot light-emitting diode device is as follows.

A hole injection layer and a 35 nm hole transport layer are sequentially coated over an ITO bottom electrode.

A heptane solution of CdZnS/ZnS quantum dot with surface ligands of octadecylphosphoric acid and Cl⁻ is spin coated with a rotation speed of 2000 rpm over the hole transport layer to form a 20 nm quantum dot light-emitting layer.

A methoanol solution of ZnO, a heptane solution of ZnO with mixed ligands of octadecyl phosphate and Cl⁻, a methoanol solution of ZnO, a heptane solution of ZnO with mixed ligands of octadecyl phosphate and Cl⁻, and a methoanol solution of ZnO are sequentially spin coated over the quantum dot light-emitting layer, where the thickness of each layer is 10 nm.

A 100 nm Ag electrode is formed over the electron transport layer using a vapor deposition method.

The manufactured quantum dot light-emitting diode is encapsulated with ultraviolet curing adhesive to obtain a quantum dot light-emitting diode device.

In another embodiment, the structure of a quantum dot light-emitting diode includes a glass substrate, an ITO anode, a hole injection layer, a 20 nm hole transport layer, a 30 nm quantum dot light-emitting layer, a 50 nm electron transport layer, and an 80 nm cathode layered from bottom to top. The light-emitting layer and the electron transport layer both include quantum dots with mixed ligands. The preparation method of the quantum dot light-emitting diode device is as follows.

A hole injection layer and a 20 nm hole transport layer are sequentially coated over an ITO bottom electrode.

A 20 mg/ml heptane solution of CdZnSe/ZnSe with mixed ligands of octanethiol and Br⁻ is spin coated with a rotation speed of 2000 rpm over the hole transport layer to form a CdZnSe/ZnSe quantum dot layer with surface ligands of octanethiol and Br⁻; a 20 mg/ml ethanol solution of CdZnSe/ZnSe is coated to form a 10 nm polar CdZnSe/ZnSe quantum dot light-emitting layer; and then a 20 mg/ml heptane solution of CdZnSe/ZnSe with mixed ligands of octanethiol and Br⁻ is coated to form a CdZnSe/ZnSe quantum dot layer with surface ligands of octanethiol and Br⁻, where the thickness of each layer is 10 nm.

A methoanol solution of ZnO, a heptane solution of ZnO with mixed ligands of octadecyl phosphate and Cl⁻, a methoanol solution of ZnO, a heptane solution of ZnO with mixed ligands of octadecyl phosphate and Cl⁻, and a methoanol solution of ZnO are sequentially spin coated over the quantum dot light-emitting layer, where the thickness of each layer is 10 nm.

An 80 nm Al electrode is formed over the electron transport layer using a vapor deposition method.

The manufactured quantum dot light-emitting diode is encapsulated with ultraviolet curing adhesive to obtain a quantum dot light-emitting diode device.

In another embodiment, the structure of a quantum dot light-emitting diode includes a glass substrate, an ITO anode, a hole injection layer, a 40 nm hole transport layer, a 60 nm quantum dot light-emitting layer, a 60 nm electron transport layer, and a 70 nm cathode layered from bottom to top. The light-emitting layer and the electron transport layer both include quantum dots with mixed ligands. The preparation method of the quantum dot light-emitting diode device is as follows.

A hole injection layer and a 40 nm hole transport layer are sequentially coated over an ITO bottom electrode.

A 20 mg/ml heptane solution of CdZnSe/ZnS with mixed ligands of tris (dimethylamino) phosphine and 6-mercapto-1-hexanol, and an ethanol solution of CdZnSe/ZnS are sequentially spin coated with a rotation speed of 2000 rpm over the hole transport layer to form a CdZnSe/ZnS quantum dot layer with surface ligands of tris (dimethylamino) phosphine and 6-mercapto-1-hexanol, a polar CdZnSe/ZnS quantum dot light-emitting layer, a CdZnSe/ZnS quantum dot layer with surface ligands of tris (dimethylamino) phosphine and 6-mercapto-1-hexanol, a polar CdZnSe/ZnS quantum dot light-emitting layer, a CdZnSe/ZnS quantum dot layer with surface ligands of tris (dimethylamino) phosphine and 6-mercapto-1-hexanol, and a polar CdZnSe/ZnS quantum dot light-emitting layer, where the thickness of each layer is 10 nm.

A heptane solution of ZnS: Mn with mixed ligands of octyl mercaptan and 3-mercaptopropionic acid, a polar ZnO solution, a heptane solution of ZnS: Mn with mixed ligands of octyl mercaptan and 3-mercaptopropionic acid, a polar ZnO solution, and a heptane solution of ZnS: Mn with mixed ligands of octyl mercaptan and 3-mercaptopropionic acid are sequentially spin coated over the quantum dot light-emitting layer, where the thickness of each layer is 10 nm.

A 70 nm Al electrode is formed over the electron transport layer using a vapor deposition method.

The manufactured quantum dot light-emitting diode is encapsulated with ultraviolet curing adhesive to obtain a quantum dot light-emitting diode device.

The present disclosure provides a quantum dot light-emitting diode, where the first quantum dot light-emitting layer is a composite material. In the composite material, the light-emitting quantum dot has the following mixed ligands on the surface thereof: the halogen ligand and the oil-soluble organic ligand that makes the composite material still oil-soluble. Compared with an existing oil-soluble composite material the surface of which is a merely oil-soluble organic ligand, in the oil-soluble composite material of the present disclosure, the halogen ligand may improve the electron transport performance and the transport rate of a carrier in a light-emitting layer, so that the electron transport rate and the hole transport rate in the light-emitting layer of a device are balanced, the light-emitting efficiency of the device is improved, the operation voltage is reduced, and the service life of the device is prolonged. Further, the material of the first electron transport layer is a first composite material, where the particle has the following mixed ligands on the surface thereof: the first halogen ligand and the fourth oil-soluble organic ligand that makes the first composite material oil-soluble. In the first composite material, the first halogen ligand may improve the electron transport performance, and the fourth oil-soluble organic ligand may effectively reduce the electron transport rate, so that the electron transport performance of the material may be adjusted, thereby adjusting the electron transport rate and the hole transport rate in a device, and further improving the light-emitting efficiency of a light-emitting layer.

The present disclosure has been described with the above embodiments, but the technical scope of the present disclosure is not limited to the scope described in the above embodiments. Other embodiments of the disclosure will be apparent to those skilled in the art from consideration of the specification and practice of the embodiments disclosed herein. It is intended that the embodiments be considered as example only and not to limit the scope of the disclosure, with a true scope and spirit of the invention being indicated by the claims.

What is claimed is:
1. A composite material comprising:
   a light-emitting quantum dot; and
   a first ligand and a second ligand bound on a surface of the light-emitting quantum dot, the first ligand including an oil-soluble organic ligand, and the second ligand including a water-soluble ligand, wherein the water-soluble ligand of the second ligand includes a mercapto acid with a carbon number less than eight; and the oil-soluble organic ligand includes one or more of a substituted or unsubstituted alkylaminophosphine, a substituted or unsubstituted alkoxyphosphine, and a substituted or unsubstituted silylphosphine.

2. The composite material of claim 1, wherein the light-emitting quantum dot includes a II-VI quantum dot, a III-V quantum dot, or a IV-VI quantum dot.

3. The composite material of claim 1, wherein the light-emitting quantum dot includes a core-shell quantum dot including a core made of a III-V material or II-VI material and a shell made of a II-VI material.

4. The composite material of claim 3, wherein the light-emitting quantum dot includes one or more of CdZnS/ZnS, CdZnSe/ZnSe, CdSeS/CdSeS/CdS, CdSe/CdZnSe/CdZnSe/ZnSe, CdZnSe/CdZnSe/ZnSe, CdS/CdZnS/CdZnS/ZnS, CdSe/ZnS, CdZnSe/ZnS, CdSe/CdS/ZnS, CdSe/ZnSe/ZnS, and CdZnSe/CdZnS/ZnS.

5. The composite material of claim 1, wherein a size of the light-emitting quantum dot is 10-20 nm.

6. The composite material of claim 1, wherein:
the oil-soluble organic ligand further includes one or more of a secondary or tertiary amine having a side chain with a carbon number of four or more, an organic carboxylic acid with a carbon number of eight or more, an organic phosphoric acid with a carbon number of eight or more, and a primary amine with a carbon number of eight or more and an alkylphosphine having a side chain with a carbon number of four or more.

7. The composite material of claim 1, wherein:
the substituted or unsubstituted alkylaminophosphine includes one or more of a tri (dimethylamino) phosphine, a tri (diethylamino) phosphine, a tri (dipropylamino) phosphine, a tri (dibutylamino) phosphine, a tri (dipentylamino) phosphine, a tri (dihexylamino) phosphine, a tri (diheptylamino) phosphine, a tri (dioctylamino) phosphine, and a dibenzyldiethylaminophosphine;

the substituted or unsubstituted alkoxyphosphine includes one or more of a diphenylmethoxyphosphine, a diphenylethoxyphosphine, a diphenylpropoxyphosphine, a diphenylbutoxyphosphine, and a chloro (diisopropylamino) methoxyphosphorus; and/or the substituted or unsubstituted silylphosphine includes one or more of a tris (trisilyl) phosphine, a tri (triethylsilyl) phosphine, a tri (tripropylsilyl) phosphine, a tri (tributylsilyl) phosphine, a tri (trispentasilyl) phosphine, a tri (trihexylsilyl) phosphine, a tri (triheptylsilyl) phosphine, and a tri (trioctylsilyl) phosphine.

8. The composite material of claim 1, wherein the second ligand includes the water-soluble ligand including one or more of a halogen ion ligand, a mercapto alcohol with a carbon number less than eight, and a mercaptoamine with a carbon number less than eight.

* * * * *